(12) United States Patent
Kim et al.

(10) Patent No.: US 12,113,153 B2
(45) Date of Patent: Oct. 8, 2024

(54) DISPLAY DEVICE

(71) Applicant: Samsung Display Co., LTD., Yongin-si (KR)

(72) Inventors: Hyun Kim, Seoul (KR); Jeong Su Park, Asan-si (KR); Jong Chan Lee, Suwon-si (KR); Hyun Wook Lee, Suwon-si (KR); Jung Eun Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 427 days.

(21) Appl. No.: 17/674,500

(22) Filed: Feb. 17, 2022

(65) Prior Publication Data

US 2022/0336710 A1  Oct. 20, 2022

(30) Foreign Application Priority Data

Apr. 19, 2021  (KR) .................. 10-2021-0050384

(51) Int. Cl.
*H01L 33/38* (2010.01)
*H01L 27/15* (2006.01)
*H01L 33/62* (2010.01)

(52) U.S. Cl.
CPC .......... *H01L 33/382* (2013.01); *H01L 27/156* (2013.01); *H01L 33/62* (2013.01)

(58) Field of Classification Search
CPC ..... H01L 33/382; H01L 27/156; H01L 33/62; H01L 33/58; H01L 25/167; H01L 25/0753; H10K 59/873; H10K 59/879; H10K 59/38; H10K 59/122; H10K 59/123; H10K 59/131; H10K 2102/351
See application file for complete search history.

(56) References Cited

U.S. PATENT DOCUMENTS

2019/0305035 A1* 10/2019 Cho ...................... H01L 33/46
2020/0105970 A1  4/2020 Ahmed et al.

FOREIGN PATENT DOCUMENTS

| KR | 10-2020-0021350 | 2/2020 |
| KR | 10-2020-0038342 | 4/2020 |
| KR | 10-2022-0002798 | 1/2022 |

* cited by examiner

*Primary Examiner* — Kyoung Lee
(74) *Attorney, Agent, or Firm* — KILE PARK REED & HOUTTEMAN PLLC

(57) ABSTRACT

A display device includes an electrode layer including a first electrode and a second electrode that are spaced apart from each other and disposed on a substrate, a light emitting element between the first electrode and the second electrode, and a capping layer disposed on the light emitting element and including at least one low refractive layer and at least one high refractive layer that are alternately disposed. The capping layer includes a first low refractive layer on the electrode layer and the light emitting element, a first high refractive layer on the first low refractive layer, and a second low refractive layer on the first high refractive layer. A thickness of the first low refractive layer is greater than a thickness of the second low refractive layer.

20 Claims, 13 Drawing Sheets

DISPLAY DEVICE

CROSS-REFERENCE TO RELATED APPLICATION(S)

This application claims priority to and benefits of Korean Patent Application No. 10-2021-0050384 under 35 U.S.C. § 119, filed in the Korean Intellectual Property Office on Apr. 19, 2021, the entire contents of which are incorporated herein by reference.

BACKGROUND

1. Technical Field

The disclosure relates to a display device, and more specifically, to a display device having an improved sealing property and an increased light emission in a display direction.

2. Description of the Related Art

The importance of display devices has steadily increased with the development of multimedia technology. Also, users of display devices such as an organic light emitting display (OLED), a liquid crystal display (LCD), and the like have been increasing and becoming more popular.

A display device is a device for displaying an image and includes a display panel, such as an organic light emitting display panel or a liquid crystal display panel. The light emitting display panel may include light emitting elements, e.g., light emitting diodes (LED). Examples of the light emitting diode include an organic light emitting diode (OLED) using an organic material as a light emitting material and an inorganic light emitting diode using an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device having an improved sealing property and an increased light emission in a display direction by including a capping layer in which a plurality of inorganic layers having different refractive indices are stacked.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may comprise an electrode layer including a first electrode and a second electrode that are spaced apart from each other and disposed on a substrate, a light emitting element between the first electrode and the second electrode, and a capping layer disposed on the light emitting element and including at least one low refractive layer and at least one high refractive layer that are alternately disposed. The capping layer may comprise a first low refractive layer on the electrode layer and the light emitting element, a first high refractive layer on the first low refractive layer, and a second low refractive layer on the first high refractive layer. A thickness of the first low refractive layer may be greater than a thickness of the second low refractive layer.

The thickness of the first low refractive layer may be about 1.5 times to about 20 times greater than the thickness of the second low refractive layer.

The capping layer may further comprise a third low refractive layer between the first high refractive layer and the second low refractive layer, and a second high refractive layer between the third low refractive layer and the second low refractive layer.

The capping layer may further comprise a fourth low refractive layer between the second high refractive layer and the second low refractive layer, and a third high refractive layer between the fourth low refractive layer and the second low refractive layer.

The light emitting element may have a shape extending in one direction, a longitudinal direction of the light emitting element may be parallel to the substrate, and the thickness of the first low refractive layer may be greater than a width of the light emitting element.

The light emitting element may comprise a first semiconductor layer, a second semiconductor layer spaced apart from the first semiconductor layer, and an element active layer between the first semiconductor layer and the second semiconductor layer. The first semiconductor layer, the element active layer, and the second semiconductor layer may be sequentially disposed in the longitudinal direction of the light emitting element. A length of the first semiconductor layer and a length of the second semiconductor layer may be different from each other.

The display device may further comprise a second high refractive layer disposed on the second low refractive layer. A thickness of the second high refractive layer may be smaller than the thickness of the first low refractive layer.

The thickness of the first low refractive layer may be greater than a thickness of the first high refractive layer.

Each of the at least one low refractive layer and the at least one high refractive layer may include an inorganic material.

A refractive index of the at least one low refractive layer may be in a range of about 1.3 to about 1.6, and a refractive index of the at least one high refractive layer may be in a range of about 1.7 to about 2.4.

The capping layer may cover the electrode layer and the light emitting element.

The display device may further comprise a contact electrode on the light emitting element. The capping layer may be disposed on the contact electrode. The contact electrode may comprise a first contact electrode electrically connecting the first electrode to an end of the light emitting element, and a second contact electrode spaced apart from the first contact electrode and electrically connecting the second electrode to another end of the light emitting element.

The capping layer may cover the contact electrode.

The display device may further comprise an insulating layer on the electrode layer. The insulating layer may include a stepped structure formed between the first electrode, and the second electrode, and the light emitting element may overlap the stepped structure on the insulating layer.

A separation space may be formed between the light emitting element and the insulating layer due to the stepped structure of the insulating layer, and a portion of the first low refractive layer may be disposed in the separation space.

The first low refractive layer may contact the light emitting element in the separation space.

According to an embodiment of the disclosure, a display device may comprise a first electrode and a second electrode that are spaced apart from each other and disposed on a substrate, a plurality of light emitting elements between the first electrode and the second electrode, and a capping layer on the plurality of light emitting elements. The capping layer may comprise a first inorganic layer having a first refractive index, a second inorganic layer on the first inorganic layer and having a second refractive index, and a third inorganic layer on the second inorganic layer and having a third refractive index. The second refractive index may be greater than the first refractive index and the third refractive index. A thickness of the first inorganic layer may be greater than a thickness of the third inorganic layer.

The capping layer may cover the first electrode, the second electrode, and the plurality of light emitting elements.

The thickness of the first inorganic layer may be about 1.5 times to about 20 times greater than the thickness of the third inorganic layer.

The thickness of the first inorganic layer may be greater than a thickness of the second inorganic layer.

The display device according to an embodiment may include the capping layer on a plurality of light emitting elements to seal the plurality of light emitting elements. The capping layer may have a structure in which the inorganic layers (low refractive layer/high refractive layer) having different refractive indices are alternately stacked. Further, the lowermost layer of the capping layer may have a thickness greater than the thicknesses of other inorganic layers disposed thereon, so that the sealing property of the display device can be improved, and the amount of light emission in the display direction may be increased, which makes it possible to improve reliability of the display device.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
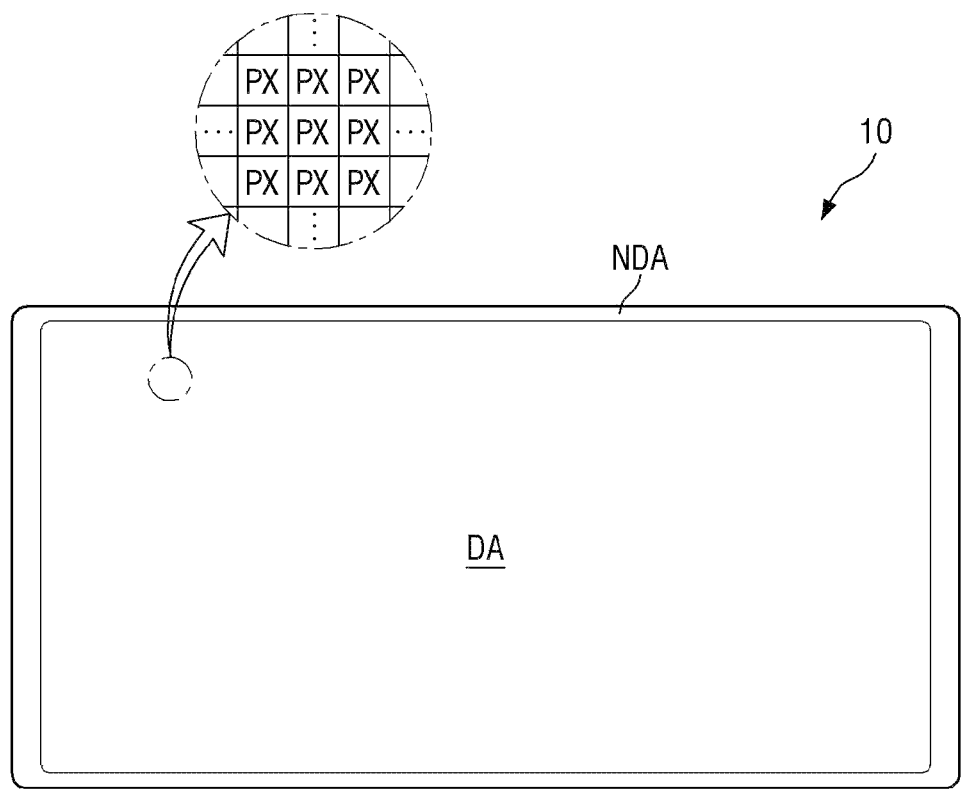
FIG. 1 is a plan view of a display device according to an embodiment.
Figure 1:
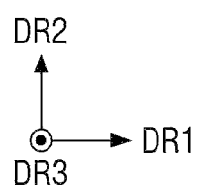

Embodiments of the invention will be described hereinafter with reference to the accompanying drawings. Although the embodiments may be modified in various manners and have additional embodiments, embodiments are illustrated in the accompanying drawings and will be mainly described in the specification. However, the scope of the invention is not limited to the embodiments in the accompanying drawings and the specification and should be construed as including all the changes, equivalents and substitutions included in the spirit and scope of the invention.

Some of the parts which are not associated with the description may not be provided in order to describe embodiments of the invention and like reference numerals refer to like elements throughout the specification.

In the drawings, sizes, relative sizes, and thicknesses of elements may be enlarged or exaggerated for clarity and/or descriptive purposes. However, the embodiments are not limited to the illustrated sizes and thicknesses. In the drawings, the thicknesses of layers, films, panels, regions, and other elements may be exaggerated for clarity. When an embodiment may be implemented differently, a specific process order may be performed differently from the described order. For example, two consecutively described processes may be performed substantially at the same time or performed in an order opposite to the described order.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity. Also, when an element is referred to as being "in contact" or "contacted" or the like to another element, the element may be in "electrical contact" or "physical contact" with another element; or in "indirect contact" or in "direct contact" with another element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein. For example, a first color filter may be any one of a red, green, or blue color filter. A second color filter may be any one of a red, green, or blue color filter. A third color filter may be any one of a red, green, or blue color filter. First and second with respect to the light blocking members may be used interchangeably in the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 80%, 5% of the stated value.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Unless otherwise defined or implied herein, all terms herein (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly defined in the specification.

FIG. 1 is a plan view of a display device according to an embodiment.

Referring to FIG. 1, a display device 10 displays a moving image or a still image. The display device 10 may be an electronic device including a display screen. Examples of the display device 10 may include a television, a laptop computer, a monitor, a billboard, an Internet-of-Things device, a mobile phone, a smartphone, a tablet personal computer (PC), an electronic watch, a smartwatch, a watch phone, a head-mounted display, a mobile communication terminal, an electronic notebook, an electronic book, a portable multimedia player (PMP), a navigation device, a game machine, a digital camera, a camcorder, and other electronic devices, which include a display screen.

The display device 10 includes a display panel having a display screen. Examples of the display panel may include an inorganic light emitting diode display panel, an organic light emitting display panel, a quantum dot light emitting display panel, a plasma display panel, and a field emission display panel. In the following description, an inorganic light emitting diode display panel is applied as the display panel and is provided below with reference to the drawings. However, the embodiments are not limited thereto, and other display panels may be applied within the same scope of technical spirit.

Hereinafter, a first direction DR1, a second direction DR2, and a third direction DR3 are defined in drawings of an embodiment of the display device 10. The first direction DR1 and the second direction DR2 may be directions perpendicular to each other in the same plane. The third direction DR3 may be a direction perpendicular to the plane on which the first direction DR1 and the second direction DR2 are disposed. The third direction DR3 is perpendicular to the first direction DR1 and the second direction DR2. In the embodiment describing the display device 10, the third direction DR3 indicates a thickness direction of the display device 10.

The display device 10 may have a rectangular shape including long and short sides. The long and short sides of the display device 10 may be respectively arranged in the first and second directions DR1 and DR2 in a plan view. A corner portion defined by adjacent two of the long side and the short side of the display device 10 may be right-angled in the plan view. However, the embodiments are not limited thereto, and the corner portion may be rounded to have a curved shape. The shape of the display device 10 is not limited to the illustrated embodiment, and may have various shapes such as a square shape, a quadrilateral shape with rounded corners (vertices), other polygonal shapes, an elliptical shape, a circular shape, or a combination thereof.

The display device 10 may have a display surface disposed on one side thereof in the third direction DR3. The third direction DR3 is the thickness direction. In embodiments describing the display device 10, unless otherwise noted, the term "upward" refers to the third direction DR3, which is the display direction, and the term "top surface" refers to a surface thereof toward the third direction DR3. Further, the term "downward" refers to an opposite direction to the third direction DR3, which is the opposite direction to the display direction, and the term "bottom surface" refers to a surface thereof toward the opposite direction to the third direction DR3. Also, the term "uppermost" surface refers to a first surface disposed in the third direction DR3, and the term "lowermost" surface refers to a last surface disposed in the opposite direction to the third direction DR3. Furthermore, "left", "right", "upper" and "lower" indicate directions when the display device 10 is viewed in a plan view. For example, "right side" indicates a side of the display device 10 in the first direction DR1, "left side" indicates the other side of the display device 10 in the first direction DR1, "upper side" indicates one side of the display device 10 in the second direction DR2, and "lower side" indicates the other side of the display device 10 in the second direction DR2.

The display device 10 may include a display area DA and a non-display area NDA. The display device 10 may display an image through the display area DA, and may not display the image in the non-display area NDA.

The shape of the display area DA may follow a contour of the display device 10. For example, the shape of the display area DA may have a rectangular shape similar to the overall shape of the display device 10 in a plan view, and the display area DA may have smaller size than the contour of the display device 10. The display area DA may be disposed in a center of the display device 10, and may cover most of the display device 10.

The display area DA may include pixels PX. The pixels PX may be arranged in a matrix shape. Each of the pixels PX may have a rectangular or square shape in the plan view. However, the shape of the pixel PX is not limited to the rectangular or square shape, and the pixel PX may have a rhombus shape, in which each side is inclined in one direction. The pixels PX may be alternately disposed in a stripe arrangement or an arrangement of PenTile®.

The non-display area NDA may be disposed around the display area DA. The non-display area NDA may entirely or partially surround the display area DA. In an embodiment, the display area DA may have a rectangular shape, and the non-display area NDA may be disposed adjacent to four sides of the display area DA. The non-display area NDA may form a bezel of the display device 10. Wires, circuit drivers, or pad portions on which an external device is mounted may be disposed in the non-display area NDA of the display device 10.

Figure 2:
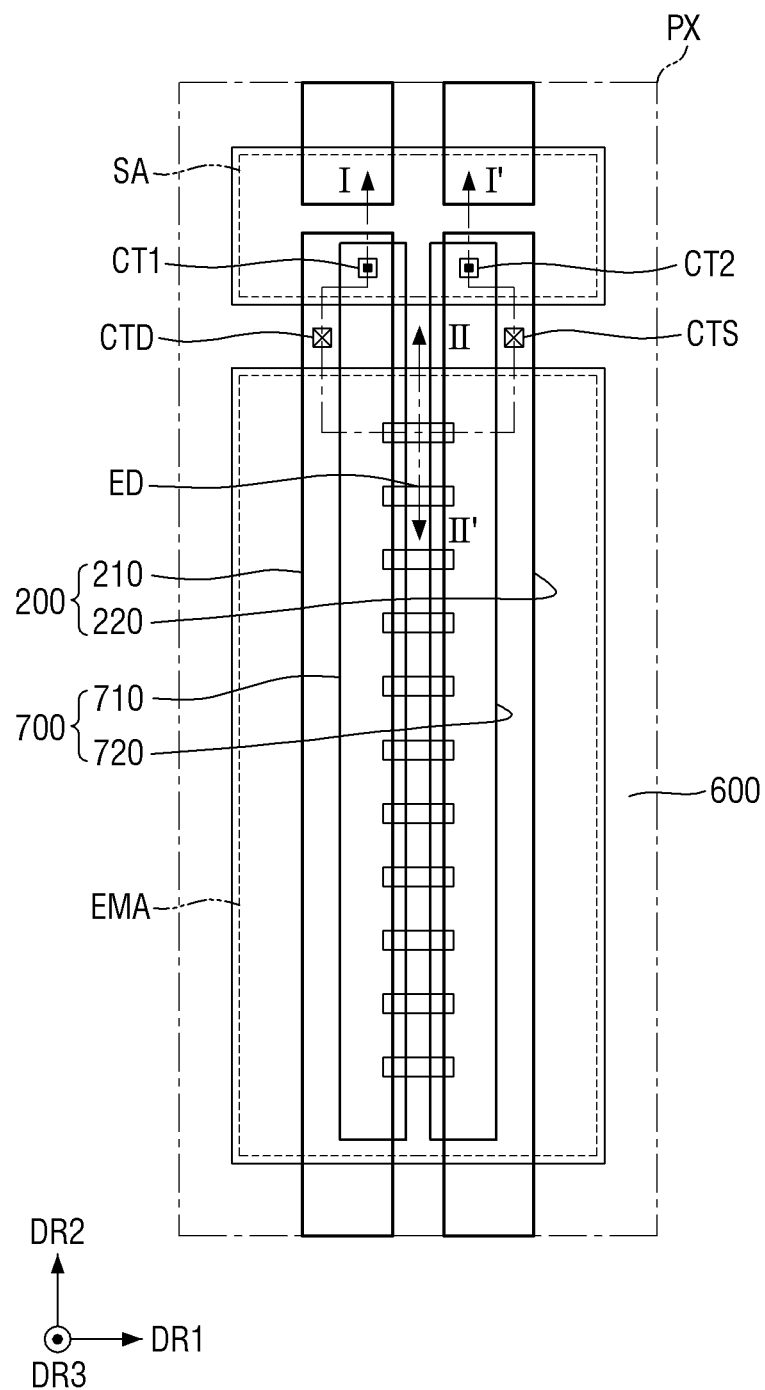
FIG. 2 is a plan layout view illustrating one pixel of a display device according to an embodiment.
Figure 3:
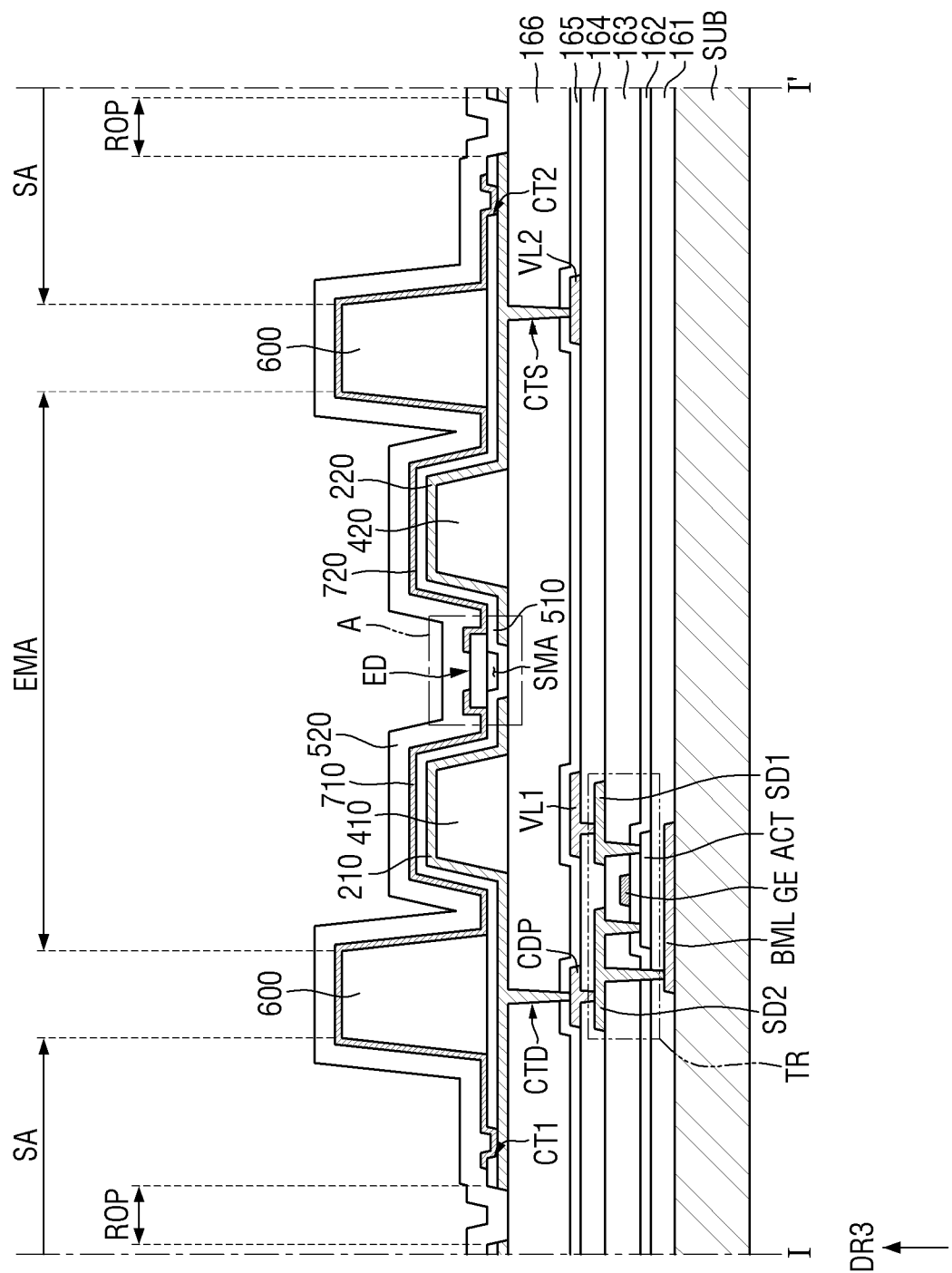
FIG. 3 is a cross-sectional view illustrating the display device shown in FIG. 2 taken along line I-I' of FIG. 2.

FIG. 2 is a plan layout view illustrating one pixel of a display device according to an embodiment. FIG. 3 is a cross-sectional view illustrating the display device shown in FIG. 2 taken along line I-I' of FIG. 2.

Referring to FIG. 2, each pixel PX of the display device 10 may include an emission area EMA and a non-emission area. A light emitting element ED emits light through the emission area EMA. The light emitted from the light emitting element ED does not arrive at the non-emission area, and the non-emission area does not emit the light.

The emission area EMA may include an area in which the light emitting element ED is disposed and an area adjacent thereto. For example, the light emitting element ED may be disposed only on a portion of the emission area EMA. The emission area EMA may further include another region for reflected or refracted light. For example, the light emitted from the light emitting element ED is reflected or refracted by another member (not illustrated) and emitted through the region of the emission area EMA.

Each pixel PX may further include a sub-region SA disposed in the non-emission area. The light emitting element ED may not be disposed in the sub-region SA. The sub-region SA may be disposed adjacent to an upper side of the emission area EMA in the pixel PX. For example, the sub-region SA may be disposed adjacent to one side of the emission area EMA in the second direction DR2 in the pixel PX. The sub-region SA may be disposed between adjacent ones of the emission areas EMA of the pixels PX disposed adjacent to each other in the second direction DR2. The sub-region SA may include a region in which an electrode layer 200 is electrically connected to contact electrodes 700 through contact portions CT1 and CT2. Further description of the structure of the contact portions CT1 and CT2 according to an embodiment is provided below with reference to the drawings.

The sub-region SA may include a separation portion ROP (refer to FIG. 3). The electrode layer 200 includes a first electrode 210 and a second electrode 220, which are disposed in each of the pixels PX. The separation portion ROP (refer to FIG. 3) of the sub-region SA may be interposed between the first electrode 210 and a second electrode 220 disposed on an adjacent pixel PX in the second direction DR2.

Referring to FIG. 3, the display device 10 (refer to FIG. 1) includes a substrate SUB, a circuit element layer disposed on the substrate SUB, a light emitting element layer disposed on the circuit element layer, and a capping layer 520 for sealing the light emitting element layer.

The substrate SUB may include an insulating substrate. The substrate SUB may be made of an insulating material such as glass, quartz, polymer resin, a combination thereof, or other suitable insulating material. The substrate SUB may include a rigid substrate, but may also include a flexible substrate which may be bent, folded, or rolled.

The circuit element layer may be disposed on the substrate SUB. The circuit element layer may include a lower metal layer BML, a semiconductor layer ACT, a first conductive layer GE, a second conductive layer SD1 and SD2, a third conductive layer VL1, VL2, and CDP, and insulating layers.

The lower metal layer BML is disposed on the substrate SUB. The lower metal layer BML may include a light blocking pattern BML. In the embodiment, the same reference character BML refers to the lower metal layer and the light blocking pattern for the convenience of description and explanation thereof. However, it should be understood that the lower metal layer may not be limited by the light blocking pattern BML, but may include other patterns (e.g. a voltage line (not illustrated)) formed from the same layer. The light blocking pattern BML of the lower metal layer may be disposed under a channel region of an active layer of the semiconductor layer ACT of a transistor TR to cover the channel region when viewed in a bottom view. However, the embodiments are not limited thereto, and the light blocking pattern BML may be omitted.

The lower metal layer BML may include a material that blocks light. For example, the lower metal layer BML may be made of an opaque metal material that blocks the light.

A buffer layer 161 may be disposed on the lower metal layer BML. The buffer layer 161 may cover an entire surface of the substrate SUB where the lower metal layer BML is disposed. The buffer layer 161 may protect transistors from moisture permeating through the substrate SUB that is susceptible to moisture permeation.

The semiconductor layer ACT is disposed on the buffer layer 161. The semiconductor layer ACT may include the active layer ACT of the transistor TR. In the embodiment, the same reference character ACT refers to the semiconductor layer and the active layer for the convenience of description and explanation thereof. However, it should be understood that the semiconductor layer may not be limited by the active layer ACT, but may include other patterns (e.g. a photo sensing pattern of a photo sensor (not illustrated)) formed from the same layer. The active layer of the semiconductor layer ACT of the transistor TR may overlap the light blocking pattern BML, of the lower metal layer. The light blocking pattern BML, may block the active layer ACT of the transistor TR.

The semiconductor layer ACT may include polycrystalline silicon, monocrystalline silicon, an oxide semiconductor, or a combination thereof. In an embodiment, amorphous silicon may be crystallized to form the polycrystalline silicon of the semiconductor layer ACT. In case that the semiconductor layer ACT includes polycrystalline silicon, the active layer ACT of the transistor TR may include doping regions doped with impurities and channel regions disposed therebetween. In an embodiment, the semiconductor layer ACT may include an oxide semiconductor. The oxide semiconductor may include, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or a combination thereof.

A gate insulating layer 162 may be disposed on the semiconductor layer ACT. The gate insulating layer 162 may insulates a gate electrode of the transistor TR. The gate insulating layer 162 may have a multilayered structure in which inorganic layers including an inorganic material, for example, at least one of silicon oxide (SiOx), silicon nitride (SiNx), and silicon oxynitride (SiOxNy) are alternately stacked.

The first conductive layer GE may be disposed on the gate insulating layer 162. The first conductive layer GE may include the gate electrode GE of the transistor TR. In the embodiment, the same reference character GE refers to the first conductive layer and the gate electrode for the convenience of description and explanation thereof. However, it should be understood that the first conductive layer may not be limited by the gate electrode GE, but may include other patterns (e.g. a gate line (not illustrated)) formed from the same layer. The gate electrode GE may overlap the channel region of the active layer ACT in the third direction DR3 which is the thickness direction of the substrate SUB. For example, the gate electrode GE may partly cover the active layer ACT.

A first interlayer insulating layer 163 may be disposed on the first conductive layer GE. The first interlayer insulating layer 163 may cover the gate electrode of the first conductive layer GE. The first interlayer insulating layer 163 may insulate the first conductive layer GE from other layers disposed thereon to protect the first conductive layer GE.

A second conductive layer SD1 and SD2 may be disposed on the first interlayer insulating layer 163. The second conductive layer SD1 and SD2 may include a drain electrode SD1 of the transistor TR and a source electrode SD2 of the transistor TR. In the embodiment, the reference characters SD1 and SD2 refer to the second conductive layer. Also, the same reference characters SD1 and SD2 respectively refer to the drain electrode and the source electrode for the convenience of description and explanation thereof. However, it should be understood that the second conductive layer may not be limited by the drain/source electrodes SD1 and SD2, but may include other patterns (e.g. a data line, a source line (not illustrated)) formed from the same layer.

The drain electrode SD1 and the source electrode SD2 of the transistor TR may be electrically connected to end regions of the active layer of the semiconductor layer ACT of the transistor TR through contact holes, respectively. For example, the drain electrode SD1 may be electrically connected to an end region of the active layer ACT, and the source electrode SD2 may be electrically connected to another end region of the active layer ACT. Each of the contact holes penetrate the first interlayer insulating layer 163 and the gate insulating layer 162. Further, the source electrode SD2 of the transistor TR may be electrically connected to the light blocking pattern BML, of the lower metal layer through another contact hole that penetrates the first interlayer insulating layer 163, the gate insulating layer 162, and the buffer layer 161.

A second interlayer insulating layer 164 may be disposed on the second conductive layer SD1 and SD2. The second interlayer insulating layer 164 may cover the drain electrode SD1 and the source electrode SD2 of the transistor TR. The second interlayer insulating layer 164 may insulates the second conductive layer SD1 and SD2 from other layers disposed thereon, and may protect the second conductive layer SD1 and SD2.

A third conductive layer VL1, VL2, and CDP may be disposed on the second interlayer insulating layer 164. The third conductive layer VL1, VL2, and CDP may include a first voltage line VL1, a second voltage line VL2, and a conductive pattern CDP. In the embodiment, the reference characters VL1, VL2, and CDP refer to the third conductive layer. Also, the same reference characters VL1, VL2, and CDP respectively refer to the first voltage line, the second voltage line, and the conductive pattern for the convenience of description and explanation thereof. However, it should be understood that the third conductive layer may not be limited by the first voltage line VL1, the second voltage line VL2, and the conductive pattern CDP, but may include other patterns (e.g. a signal line, a dummy pattern (not illustrated)) formed from the same layer.

The first voltage line VL1 may overlap at least a portion of the drain electrode SD1 of the transistor TR in the thickness direction of the substrate SUB. For example, the first voltage line VL1 may partly cover the drain electrode SD1. A high potential voltage (or a first source voltage) may be applied to the transistor TR through the first voltage line VL1.

The second voltage line VL2 may be electrically connected to the second electrode 220 through the second electrode contact hole CTS penetrating a via layer 166 and a passivation layer 165. Further description of the via layer 166 and the passivation layer 165 according to the embodiment is provided below with reference to the drawings. A low potential voltage (or a second source voltage) lower than the high potential voltage may be applied to the first voltage line VL1 through the second voltage line VL2. For example, the high potential voltage (or a first power voltage) may be applied to the transistor TR through the first voltage line VL1, and the low potential voltage (or a second power voltage) lower than the high potential voltage may be applied to the first voltage line VL1 through the second voltage line VL2.

A conductive pattern CDP may be electrically connected to the source electrode SD2 of the transistor TR. The conductive pattern CDP may be electrically connected to the source electrode SD2 of the transistor TR through a contact hole that penetrates the second interlayer insulating layer 164. Further, the conductive pattern CDP may be electrically connected to the first electrode 210 through a first electrode contact hole CTD that penetrates the via layer 166 and the passivation layer 165. Further description of the via layer 166 and the passivation layer 165 according to the embodiment is provided below with reference to the drawings. The transistor TR may transmit the first source voltage applied from the first voltage line VL1 to the first electrode 210 through the conductive pattern CDP.

The passivation layer 165 may be disposed on the third conductive layer VL1, VL2, and CDP. The passivation layer 165 may cover the third conductive layer VL1, VL2, and CDP. The passivation layer 165 may protect the third conductive layer VL1, VL2, and CDP.

Each of the buffer layer 161, the gate insulating layer 162, the first interlayer insulating layer 163, the second interlayer insulating layer 164, and the passivation layer 165 described above may be formed of inorganic layers, and the inorganic layers may be alternately stacked. For example, each of the buffer layer 161, the gate insulating layer 162, the first interlayer insulating layer 163, the second interlayer insulating layer 164, and the passivation layer 165 may have a double layer structure formed by stacking inorganic layers including at least one of silicon oxide (SiOx), silicon nitride (SiNx), and silicon oxynitride (SiOxNy). Each of the buffer layer 161, the gate insulating layer 162, the first interlayer insulating layer 163, the second interlayer insulating layer 164, and the passivation layer 165 may have a multilayer structure formed by alternately stacking the inorganic layers. However, the embodiment are not limited thereto, and each of the buffer layer 161, the gate insulating layer 162, the first interlayer insulating layer 163, the second interlayer insulating layer 164, and the passivation layer 165 may have a single layer structure including the above-described insulating material.

The via layer 166 may be disposed on the passivation layer 165. The via layer 166 may include an organic insulating material. The via layer 166 may include polyimide (PI). The via layer 166 may cover the passivation layer 165 to flatten a surface thereof. Accordingly, a top surface (or a surface) of the via layer 166, on which the light emitting element layer is disposed, may be substantially flat regardless of a shape or a pattern disposed thereunder.

Hereinafter, the structure of the light emitting element layer disposed on the circuit element layer is provided below with reference to FIGS. 2 and 3.

The light emitting element layer may be disposed on the circuit element layer. The light emitting element layer may be disposed on the via layer 166. The light emitting element layer may include a first bank 410 and 420, the electrode layer 200, a first insulating layer 510, a second bank 600, light emitting elements ED, and contact electrodes 700.

The first bank 410 and 420 may be disposed on the via layer 166 in the emission area EMA. The first bank 410 and 420 may be disposed on (e.g. directly contact) one surface of the via layer 166. The first bank 410 and 420 may be in electrical and physical contact with a surface of the via layer 166 in the upward direction (e.g. the third direction DR3). At least a portion of the first bank 410 and 420 may protrude upward (e.g., one side in the third direction DR3) with respect to one surface of the via layer 166. The protruding portion of the first bank 410 and 420 may have an inclined side surface. The first bank 410 and 420 may change a direction of irradiating the light emitted from the light emitting element ED on the inclined side surface of the first bank 410 and 420 in the upward direction (e.g., the third direction DR3 or a display direction).

The first bank 410 and 420 may include a first sub-bank 410 and a second sub-bank 420 spaced apart from each other. The light emitting element ED is disposed in a space between the first sub-bank 410 and the second sub-bank 420. The first sub-bank 410 and the second sub-bank 420 may change the direction of irradiating the light emitted from the light emitting element ED toward the display direction.

Although the side surface of the first bank 410 and 420 having an inclined linear shape is illustrated in FIG. 3. However, it should be noted that the shape of the side surface of the first bank 410 and 420 is not limited by FIG. 3. For example, the side surface (or an outer surface) of the first bank 410 and 420 may have a curved semicircular or semi-elliptical shape. In an embodiment, the first bank 410 and 420 may include an organic insulating material such as polyimide (PI). It should be noted that the material of the first bank 410 and 420 is note limited by the above-mentioned material.

The electrode layer 200 may have a shape extending in one direction and may cross the emission area EMA and the sub-region SA. The electrode layer 200 may transmit an electrical signal applied from the circuit element layer to the light emitting element ED, and the light emitting element ED may emit light. The electrode layer 200 may generate an electric field to align the light emitting elements ED.

The electrode layer 200 may be disposed on the first bank 410 and 420 and an exposed portion of the via layer 166, which is exposed through a space between the first sub-bank 410 and the second sub-bank 420. The electrode layer 200 may be disposed on the first bank 410 and 420 in the emission area EMA. The electrode layer 200 may be disposed on the via layer 166 exposed by the first sub-bank 410 and the second sub-bank 420 in the non-emission area.

The electrode layer 200 may include the first electrode 210 and the second electrode 220. The first electrode 210 and the second electrode 220 may be spaced apart from each other.

The first electrode 210 may be disposed on a left side of each pixel PX in a plan view. The first electrode 210 may have a shape extending in the second direction DR2 in the plan view. The first electrode 210 may cross the emission area EMA and the sub-region SA. The first electrode 210 may extend in the second direction DR2 in the plan view. The separation portion ROP of the sub-region SA may be interposed between the first electrode 210 and a first electrode 210 of an adjacent pixel PX in the second direction DR2.

The second electrode 220 may be separated from the first electrode 210 in the first direction DR1. The second electrode 220 may be disposed on the right side of each pixel PX in a plan view. The second electrode 220 may have a shape extending in the second direction DR2 in the plan view. The second electrode 220 may cross the emission area EMA and the sub-region SA. The second electrode 220 may extend in the second direction DR2 in the plan view. The separation portion ROP of the sub-region SA may be interposed between the second electrode 220 and a second electrode 220 of an adjacent pixel PX in the second direction DR2.

The first electrode 210 may be disposed on the first sub-bank 410 in the emission area EMA. The second electrode 220 may be disposed on the second sub-bank 420 in the emission area EMA. The first electrode 210 may extend outward from the first sub-bank 410 and may also be disposed on the via layer 166 exposed by the first sub-bank 410. Also, the second electrode 220 may extend outward from the second sub-bank 420 and may also be disposed on the via layer 166 exposed by the second sub-bank 420. The first electrode 210 and the second electrode 220 may be spaced apart from each other and face each other in a separation region formed between the first sub-bank 410 and the second sub-bank 420. The via layer 166 may be partially exposed in a region formed between the first electrode 210 and the second electrode 220.

The separation portion ROP of the sub-region SA may be interposed between the first electrode 210 and a first electrode 210 of an adjacent pixel PX in the second direction DR2. Also, the separation portion ROP of the sub-region SA may be interposed between the second electrode 220 and a second electrode 220 of an adjacent pixel PX in the second direction DR2. Accordingly, a portion of the via layer 166 disposed in the separation portion ROP of the sub-region SA may be exposed between the first electrode 210 and the second electrode 220.

The first electrode 210 may be electrically connected to the conductive pattern CDP of the circuit element layer through the first electrode contact hole CTD. The first electrode contact hole CTD may penetrate the via layer 166 and the passivation layer 165. The first electrode 210 may be in electrical and physical contact with a top surface of the conductive pattern CDP exposed by the first electrode contact hole CTD. The first source voltage of the first voltage line VL1 may be transmitted to the first electrode 210 through the conductive pattern CDP.

The second electrode 220 may be electrically connected to the second voltage line VL2 of the circuit element layer through the second electrode contact hole CTS. The second electrode contact hole CTS may penetrate the via layer 166 and the passivation layer 165. The second electrode 220 may be in electrical and physical contact with a top surface of the second voltage line VL2 exposed by the second electrode contact hole CTS. The second source voltage of the second voltage line VL2 may be transmitted to the second electrode 220.

The electrode layer 200 may include a conductive material having high reflectivity. For example, the electrode layer 200 may include a metal such as silver (Ag), copper (Cu), or aluminum (Al) as a material having high reflectivity, or may include an alloy including aluminum (Al), nickel (Ni), lanthanum (La), and the like. The electrode layer 200 may reflect the light emitted from the light emitting element ED and guide the light toward the side surface of the first bank 410 and 420 in the upward direction of each pixel PX.

However, the embodiments are not limited thereto, and the electrode layer 200 may further include a transparent conductive material. Examples of the transparent conductive material for the electrode layer 200 may include ITO, IZO, ITZO, a combination thereof, or other suitable transparent conductive materials. In an embodiment, the electrode layer 200 may have a multi-layer structure including at least one transparent conductive material and at least one metal layer having high reflectivity. The electrode layer 200 may have a single layer formed one of the above-mentioned materials. For example, the electrode layer 200 may have a stacked structure of ITO/Ag/ITO, ITO/Ag/IZO, ITO/Ag/ITZO/IZO, a combination thereof, or other suitable stack structures.

The first insulating layer 510 may be disposed on the via layer 166 on which the electrode layer 200 is formed. The first insulating layer 510 may protect the electrode layer 200, and also insulate the first electrode 210 from the second electrode 220.

The first insulating layer 510 may include an inorganic insulating material. Examples of the inorganic insulating material of the first insulating layer 510 may include at least one inorganic insulating material of silicon oxide (SiOx), silicon nitride (SiNx), silicon oxynitride (SiOxNy), aluminum oxide (AlxOy), and aluminum nitride (AlN). The first insulating layer 510 made of the inorganic insulating material may have a surface shape formed by the electrode layer 200 and the first bank 410 and 420 disposed thereunder. For example, the first insulating layer 510 may have a stepped structure according to a stepped profile of the electrode layer 200 and the first bank 410 and 420 disposed on the via layer 166. A top surface of the first insulating layer 510 may be partially recessed to form a stepped structure in a region between the first electrode 210 and the second electrode 220. Accordingly, a top surface of the first insulating layer 510 disposed on the first electrode 210 and the second electrode 220 may be higher than a top surface of the first insulating layer 510 disposed on the via layer 166. The first electrode 210 and the second electrode 220 may not be disposed on the via layer 166. In the embodiment, the height of the layer such as the first insulating layer 510 may be measured from a flat reference surface (e.g., the top surface of the via layer 166).

The first insulating layer 510 may include a first contact portion CT1 partially exposing a top surface of the first electrode 210 and a second contact portion CT2 partially exposing a top surface of the second electrode 220 in the sub-region SA. The first electrode 210 may be electrically connected to a first contact electrode 710 through the first contact portion CT1 penetrating the first insulating layer 510 in the sub-region SA. The second electrode 220 may be electrically connected to a second contact electrode 720 through the second contact portion CT2 penetrating the first insulating layer 510 in the sub-region SA. Further description of the structure of the first contact electrode 710 and the second contact electrode 720 is provided below with reference to the drawings.

The second bank 600 may be disposed on the first insulating layer 510. The second bank 600 may be arranged in a grid shape extending in the first and second directions DR1 and DR2 in a plan view.

The second bank 600 may be disposed on boundaries of adjacent pixels PX to divide the pixels PX. The second bank 600 may divide the emission area EMA and the sub-region SA. Further, a height of the second bank 600 may be greater than that of the first bank 410 and 420. Accordingly, in an inkjet printing process for aligning the light emitting elements ED during manufacturing the display device 10, ink sprayed for each light emitting element ED may not be mixed with ink sprayed for an adjacent pixel PX and may be disposed only in the emission area EMA.

The light emitting elements ED may be arranged in the emission area EMA. The light emitting elements ED may not be disposed in the sub-region SA.

The light emitting elements ED may be disposed on the first insulating layer 510 between the first sub-bank 410 and the second sub-bank 420. The light emitting elements ED may be disposed between the first electrode 210 and the second electrode 220 on the first insulating layer 510.

The light emitting element ED may extend in one direction. Ends of the light emitting element ED may be disposed on the first electrode 210 and the second electrode 220, respectively. For example, one end of the light emitting elements ED may be disposed on the first electrode 210 and the other end thereof may be disposed on the second electrode 220.

A length of each light emitting element ED (i.e., a length of the light emitting element ED in the first direction DR1 in FIG. 2) may be smaller than the shortest interval between the first sub-bank 410 and the second sub-bank 420 in the first direction DR1. Further, the length of the light emitting element ED may be greater than the shortest interval between the first electrode 210 and the second electrode 220 in the first direction DR1. The interval between the first sub-bank 410 and the second sub-bank 420 in the first direction DR1 may be greater than the length of the light emitting element ED, and the interval between the first electrode 210 and the second electrode 220 in the first direction DR1 may be smaller than the length of the light emitting element ED. Therefore, the ends of the light emitting elements ED may be disposed on the first electrodes 210 and the second electrodes 220, respectively, in the region between the first sub-bank 410 and the second sub-bank 420.

The light emitting elements ED may be disposed on the first insulating layer 510 and may overlap the stepped structure of the first insulating layer 510. For example, the light emitting elements ED may cover the stepped structure of the first insulating layer 510. A separation space SMA may be formed between each of the light emitting elements ED and the first insulating layer 510 due to the stepped structure of the first insulating layer 510 formed between the first electrode 210 and the second electrode 220. For example, one end of the light emitting element ED may be disposed on (e.g. directly contact) a portion of the first insulating layer 510 overlapping the first electrode 210, and the other end of the light emitting element ED may be disposed on (e.g. directly contact) a portion of the first insulating layer 510 overlapping the second electrode 220. However, a central portion of the light emitting element ED may be spaced apart from the first insulating layer 510 to interpose the separation space SMA.

The light emitting elements ED may be spaced apart from each other along the second direction DR2 and may be aligned substantially parallel with each other. The first electrode 210 and the second electrode 220 may extend in the second direction DR2.

The contact electrodes 700 may be disposed on the first insulating layer 510 on which the light emitting element ED is disposed. The contact electrodes 700 may include the first contact electrode 710 and the second contact electrode 720 spaced apart from each other.

The first contact electrode 710 may be disposed on the first electrode 210 in the emission area EMA. The first contact electrode 710 may extend in the second direction DR2 on the first electrode 210. The first contact electrode 710 may be in electrical and physical contact with the first electrode 210 and one end of the light emitting element ED.

The first contact electrode 710 may be in electrical and physical contact with the first electrode 210 that is exposed through the first contact portion CT1 passing through the first insulating layer 510 in the sub-region SA. The first contact electrode 710 may be in electrical and physical contact with the end of the light emitting element ED in the emission area EMA. For example, the first contact electrode 710 may electrically connect the first electrode 210 to the end of the light emitting element ED.

The second contact electrode 720 may be disposed on the second electrode 220 in the emission area EMA. The second contact electrode 720 may extend in the second direction DR2 on the second electrode 220. The second contact electrode 720 may be in electrical and physical contact with the second electrode 220 and the other end of the light emitting element ED.

The second contact electrode 720 may be in electrical and physical contact with the second electrode 220 that is exposed through the second contact portion CT2 passing through the first insulating layer 510 in the sub-region SA. The second contact electrode 720 may be in electrical and physical contact with the other end of the light emitting element ED in the emission area EMA. For example, the second contact electrode 720 may electrically connect the second electrode 220 to the other end of the light emitting element ED.

The first contact electrode 710 and the second contact electrode 720 may be spaced apart from each other on the light emitting element ED. The first contact electrode 710 may be electrically insulated from the second contact electrode 720.

The first and second contact electrodes 710 and 720 may include the same material. For example, each of the first and second contact electrodes 710 and 720 may include a conductive material. For example, the first and second contact electrodes 710 and 720 may include ITO, IZO, ITZO, aluminum (Al), or a combination thereof. For example, each of the first and second contact electrodes 710 and 720 may include a transparent conductive material. Since each of the first and second contact electrodes 710 and 720 includes the transparent conductive material, the light emitted from the light emitting element ED may pass through the first and second contact electrodes 710 and 720 to proceed toward the first and second electrodes 210 and 220, and may be reflected from surfaces of the first and second electrodes 210 and 220.

The first and second contact electrodes 710 and 720 may include the same material, and may be formed from the same layer. The first and second contact electrodes 710 and 720 may be simultaneously formed through a same process.

The capping layer 520 may be disposed on the light emitting element layer. The capping layer 520 may be disposed on the contact electrodes 700. The capping layer 520 may cover the light emitting element layer disposed thereunder. The capping layer 520 may cover the first bank 410 and 420, the electrode layer 200, the first insulating layer 510, the light emitting elements ED, and the contact electrodes 700. The capping layer 520 may be disposed above the second bank 600 to cover the second bank 600 as well.

The capping layer 520 may protect the light emitting element layer disposed thereunder from foreign substances such as dust particles, or moisture/oxygen. The capping layer 520 may protect the first bank 410 and 420, the electrode layer 200, the first insulating layer 510, the light emitting elements ED, and the contact electrodes 700. The capping layer 520 may include stacked layers having different refractive indices. Accordingly, the capping layer 520 may also adjust a direction of light irradiation, so that the lights emitted from the ends of the light emitting element ED may be guided in an upward direction of the light emitting element ED. For example, the lights emitted from the light emitting element ED may be focused in the upward direction (i.e., the third direction DR3) by the capping layer 520. A detailed description of the capping layer 520 is provided below with reference to the drawings.

Figure 4:
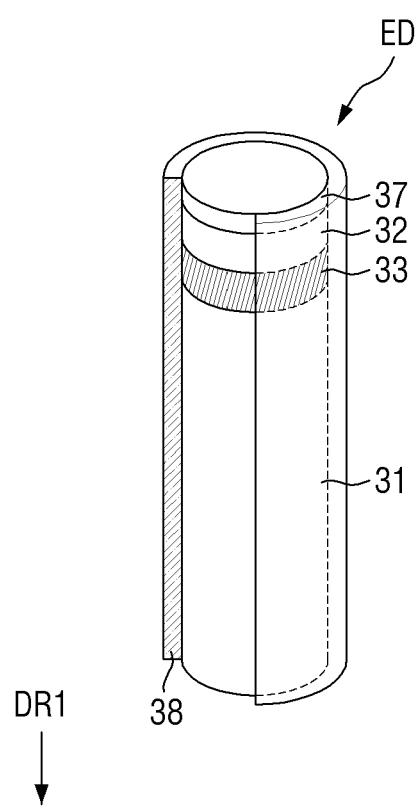
FIG. 4 is a schematic diagram of a light emitting element according to an embodiment.

FIG. 4 is a schematic diagram of a light emitting element according to an embodiment.

Referring to FIG. 4, the light emitting element ED a particulate element may have a rod or cylindrical shape having a predetermined aspect ratio. The light emitting element ED may be a particulate element. A length of the light emitting element ED may be greater than a thickness of the light emitting element ED. In case that the light emitting element ED has a cylindrical shape, the length of the light emitting element ED may be greater than a diameter or width of the light emitting element ED in the third direction DR3. The aspect ratio of the light emitting element ED may be about 6:5 to about 100:1. However, it should be noted that the aspect ratio of the light emitting element ED is not limited thereto.

The light emitting element ED may have a size of a nanometer scale (equal to or greater than 1 nm and less than 1 μm) to a micrometer scale (equal to or greater than 1 μm and less than 1 mm). In an embodiment, both the thickness (or the diameter or width) and the length of the light emitting element ED may be on a nanometer scale, or on a micrometer scale. In an embodiment, the thickness (or the diameter or width) of the light emitting element ED may be on a nanometer scale, and the length of the light emitting element ED may be on a micrometer scale. Some of the light emitting elements ED may have a thickness (or the diameter or width) and/or length on a nanometer scale, and some others of the light emitting elements ED may have a thickness (or the diameter or width) and/or length on a micrometer scale.

In an embodiment, the light emitting element ED may include an inorganic light emitting diode. The inorganic light emitting diode may include semiconductor layers. For example, the inorganic light emitting diode may include a first conductive (e.g., n-type) semiconductor layer, a second conductive (e.g., p-type) semiconductor layer, and an active semiconductor layer interposed therebetween. The active semiconductor layer may receive holes and electrons from the first conductive semiconductor layer and the second conductive semiconductor layer, respectively, and the holes and electrons may be combined in the active semiconductor layer to emit light.

In an embodiment, the above-described semiconductor layers may be sequentially stacked along a longitudinal direction of the light emitting element ED. The light emitting element ED may include a first semiconductor layer 31, an element active layer 33, and a second semiconductor layer 32 that are sequentially stacked in the longitudinal direction.

The first semiconductor layer 31 may be doped with a first conductive dopant. The first conductive dopant may include Si, Ge, Sn, or a combination thereof. In an embodiment, the first semiconductor layer 31 may include n-GaN doped with n-type Si.

The second semiconductor layer 32 may be spaced apart from the first semiconductor layer 31, and the element active layer 33 may be interposed therebetween. The second semiconductor layer 32 may be doped with a second conductive dopant such as Mg, Zn, Ca, Se, Ba, or a combination thereof. In an embodiment, the second semiconductor layer 32 may be p-GaN doped with p-type Mg.

The element active layer 33 may include a material having a single or multiple quantum well structure. As described above, the element active layer 33 may emit light by combining of electron-hole pairs based on an electrical signal applied through the first semiconductor layer 31 and the second semiconductor layer 32.

In an embodiment, the element active layer 33 may have a structure in which semiconductor layers having a large band gap energy and semiconductor layers having a small band gap energy are alternately stacked. The element active layer 33 may include group III to group V semiconductor materials according to a wavelength band of the emitted light.

Light generated from the element active layer 33 may be emitted through an outer surface (e.g., end surfaces of the light emitting element ED) and a side surface of the light emitting element ED. The light may be emitted from the light emitting element ED in a longitudinal direction and a radial direction thereof. For example, emission direction of the light generated from the element active layer 33 is not limited to one direction.

The first semiconductor layer 31 may have a different thickness from the second semiconductor layer 32. The thicknesses of the first and second semiconductor layers 31 and 32 may be measured in an extension direction (e.g., the longitudinal direction or the first direction DR1) of the light emitting element ED. A thickness of the first semiconductor layer 31 may be greater than that of the second semiconductor layer 32.

The element active layer 33 may be biased in the extension direction of the light emitting element ED. For example, the element active layer 33 may be adjacent to the second semiconductor layer 32. As described above, the thickness of the first semiconductor layer 31 may be different from the thickness of the second semiconductor layer 32, and the element active layer 33 may be interposed between the first and second semiconductor layers 31 and 32. Thus, the element active layer 33 may be adjacent to an end of the light emitting element ED. Accordingly, a distance between the element active layer 33 and an end surface of the light emitting element ED may be different from a distance between the element active layer and another end surface of the light emitting element ED. The distance between the end surface of the light emitting element ED, on which the second semiconductor layer 32 is disposed, and one surface of the element active layer 33 facing the end surface of the light emitting element ED may be smaller than the distance between the other end surface of the light emitting element ED, on which the first semiconductor layer 31 is disposed, and the other surface of the element active layer 33 facing the other end surface of the light emitting element ED. Since the element active layer 33 is adjacent to the one side of the light emitting element ED in the longitudinal direction, the intensity of the light emitted through the end surface of the light emitting element ED, which is adjacent to the element active layer 33, is greater than the intensity of the light emitted through the other end surface of the light emitting element ED, which is spaced apart from the element active layer 33. For example, since the element active layer 33 emitting light is biased to the end surface of the light emitting element ED, the intensity of light emitted from the light emitting element ED may be asymmetrical.

The light emitting element ED may further include an element electrode layer 37 disposed on the second semiconductor layer 32. The element electrode layer 37 may be in electrical and physical contact with the second semiconductor layer 32. The element electrode layer 37 may be an ohmic contact electrode. However, it should be noted that the element electrode layer 37 is not limited thereto, and may be a Schottky contact electrode.

Figure 5:
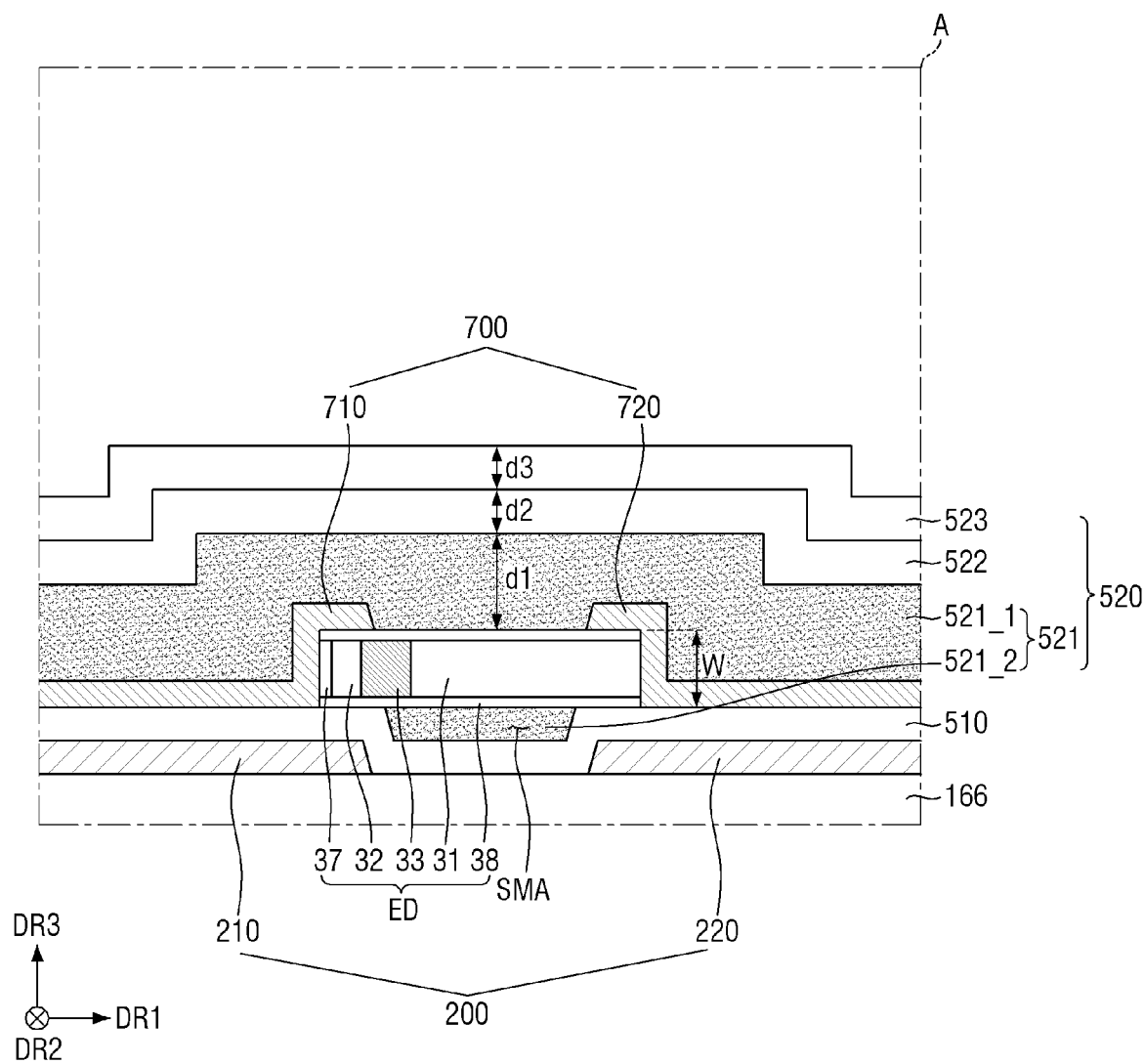
FIG. 5 is an enlarged cross-sectional view illustrating area A of FIG. 3.

The element electrode layer 37 may be disposed between the semiconductor layer 32 and a first contact electrode 710 (refer to FIG. 5) of contact electrodes 700 (refer to FIG. 5) and may reduce resistance between the semiconductor layer 32 and the first contact electrode 710 (refer to FIG. 5) when the ends of the light emitting element ED are electrically connected to the contact electrodes 700 (refer to FIG. 5). An electrical signal may be applied to the first and second semiconductor layers 31 and 32 through the contact electrodes 700 (refer to FIG. 5). The element electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). The element electrode layer 37 may include an n-type or p-type doped semiconductor material.

The light emitting element ED may further include an element insulating layer 38 surrounding outer peripheral surfaces of the first semiconductor layer 31, the second semiconductor layer 32, the element active layer 33 and/or the element electrode layer 37. The element insulating layer 38 may surround at least the outer peripheral surface of the element active layer 33. The element insulating layer 38 may extend in one direction in which the light emitting element ED extends. The element insulating layer 38 may protect members disposed inside thereof. The element insulating layer 38 is made of insulating materials to prevent an electrical short circuit that may occur by direct input of an electric signal to the element active layer 33. Further, the element insulating layer 38 may surround the element active layer 33 and the first and second semiconductor layers 31 and 32 to protect the outer peripheral surfaces thereof, and thus light emission efficiency of the light emitting element ED may not be degraded.

The element insulating layer 38 may include an insulating material such as silicon oxide (SiOx), silicon nitride (SiNx), silicon oxynitride (SiOxNy), aluminum nitride (AlNx), aluminum oxide (AlOx), or a combination thereof. The element insulating layer 38 illustrated in FIG. 4 has a single layer structure, but the embodiments are not limited thereto. In an embodiment, the element insulating layer 38 may have a multilayer structure having layers stacked therein.

Figure 6:
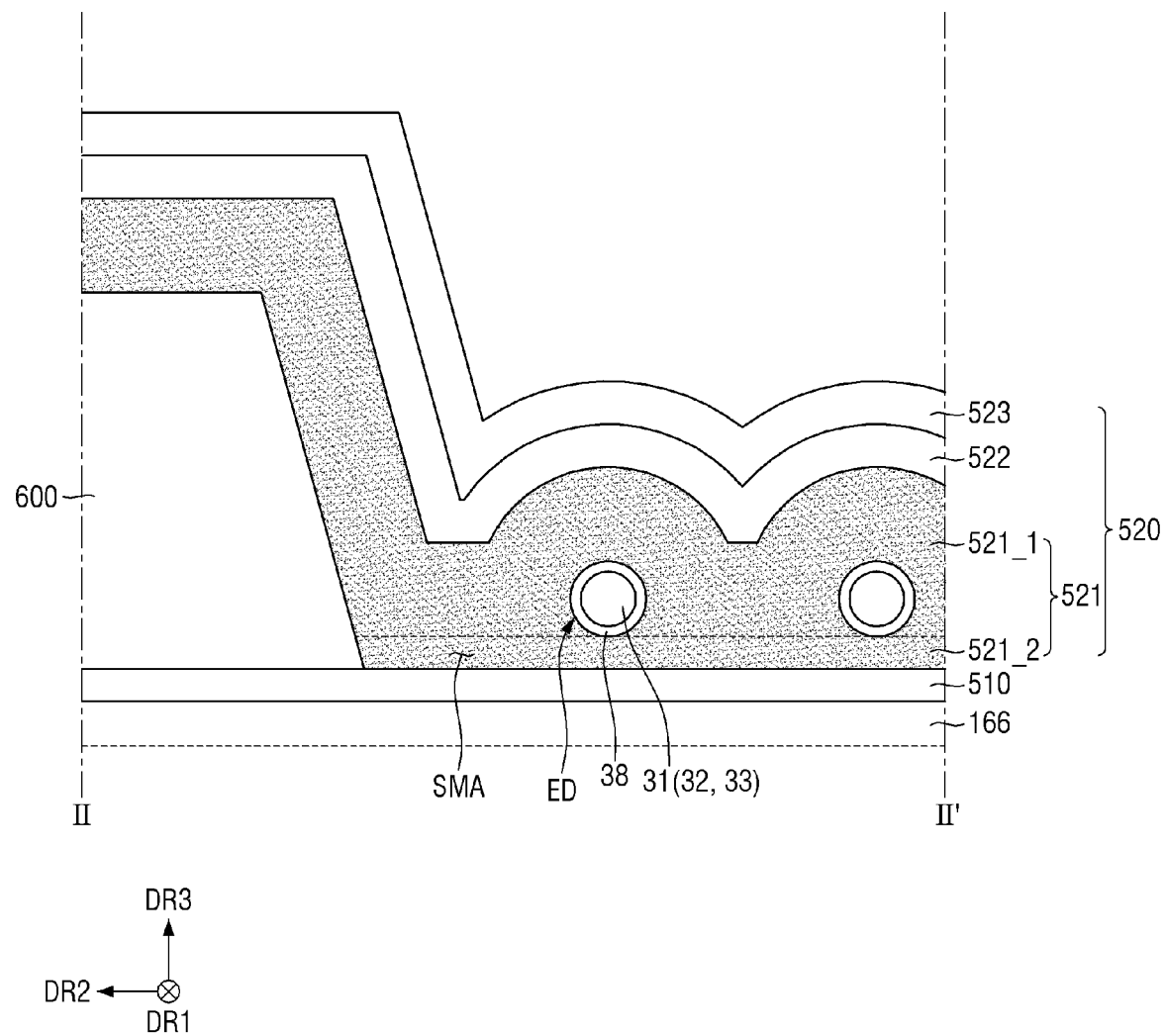
FIG. 6 is a cross-sectional view illustrating the display device shown in FIG. 2 taken along line II-II' of FIG. 2.

FIG. 5 is an enlarged cross-sectional view illustrating area A of FIG. 3. FIG. 6 is a cross-sectional view illustrating the display device shown in FIG. 2 taken along line II-II' of FIG. 2.

Referring to FIGS. 5 and 6, the light emitting element ED may be disposed in the longitudinal direction (e.g. the first direction DR1) parallel to the top surface (or the top surface of the via layer 166) of the substrate SUB (refer to FIG. 3). The semiconductor layers of the light emitting element ED may be sequentially arranged along the direction (e.g. the first direction DR1) parallel to the top surface of the via layer 166. For example, the first semiconductor layer 31, the element active layer 33, and the second semiconductor layer 32 of the light emitting element ED may be sequentially stacked in the direction (e.g. the first direction DR1) parallel to the top surface of the via layer 166. For example, the first semiconductor layer 31, the element active layer 33, and the second semiconductor layer 32 of the light emitting element ED may be laid on a first insulating layer 510, and the longitudinal direction (e.g. the first direction DR1 of FIG. 4) of the light emitting element ED may be perpendicular to a vertical direction (e.g. the third direction DR3) of the pixel PX (refer to FIG. 2) of the display device 10 (refer to FIG. 1).

In the light emitting element ED, the first semiconductor layer 31, the element active layer 33, the second semiconductor layer 32, and the element electrode layer 37 may be sequentially formed in the direction (e.g. the first direction DR1) parallel to the top surface of the via layer 166 in the cross-sectional view across ends of the light emitting element ED.

One end of the light emitting element ED may be disposed on the first electrode 210 and the other end thereof is disposed on the second electrode 220. However, the embodiments are not limited thereto, and the end of the light emitting element ED may be disposed on the second electrode 220 and the other end thereof may be disposed on the first electrode 210.

The end of the light emitting element ED may be disposed above an end of the first electrode 210, and the end of first electrode 210 may face the second electrode 220. The other end of the light emitting element ED may be disposed above an end of the second electrode 220, and the end of the second electrode 220 may face the first electrode 210. The ends of the light emitting element ED may be disposed on a top surface of the first insulating layer 510 covering the ends of the first electrode 210 and the second electrode 220, which face each other. The ends of the light emitting element ED may be in electrical and physical contact with the top surface of the first insulating layer 510.

As described above, the first insulating layer 510 made of an inorganic material may have a shape according to a stepped profile of the electrode layer 200 disposed thereunder. For example, the first insulating layer 510 may have a stepped structure according to the stepped profile of the electrode layer 200 disposed under the first insulating layer 510. A top surface of the first insulating layer 510 may be partially recessed to form the stepped structure in a region between the first electrode 210 and the second electrode 220. Therefore, the separation space SMA may be formed between the light emitting element ED and the top surface of the first insulating layer 510, which is partially recessed between the first electrode 210 and the second electrode 220.

In the stepped portion formed in the first insulating layer 510, a portion of the light emitting element ED may be in electrical and physical contact with the first insulating layer 510, and another portion of the light emitting element ED may be spaced apart from the first insulating layer 510. Both ends of the light emitting element ED may be in electrical and physical contact with the first insulating layer 510, and a center portion of the light emitting element ED may be spaced apart from the first insulating layer 510.

The first contact electrode 710 may be disposed on the first electrode 210 and may be in electrical and physical contact with the end of the light emitting element ED. The first contact electrode 710 may cover one end surface of the light emitting element ED. The first contact electrode 710 may be in electrical and physical contact with the element insulating layer 38 and the element electrode layer 37 of the light emitting element ED.

The second contact electrode 720 may be disposed on the second electrode 220 and may be in electrical and physical contact with the other end of the light emitting element ED. The second contact electrode 720 may cover the other end surface of the light emitting element ED. The second contact electrode 720 may be in electrical and physical contact with the element insulating layer 38 and the first semiconductor layer 31 of the light emitting element ED.

The first contact electrode 710 and the second contact electrode 720 may be spaced apart from each other on the light emitting element ED.

The capping layer 520 may be disposed on the light emitting element ED and the contact electrodes 700. The capping layer 520 may be disposed on elements of the light emitting element layer to seal them. The capping layer 520 may entirely cover the first insulating layer 510, the light emitting elements ED, the contact electrodes 700, and the second bank 600. The capping layer 520 may prevent permeation of oxygen or moisture into the light emitting element layer. Further, the capping layer 520 may also adjust a direction of light irradiation such that the light emitted from the light emitting element ED may be guided in an upward direction of the light emitting element ED. For example, the lights emitted from the light emitting element ED may be focused in the upward direction (i.e., the third direction DR3) by the capping layer 520.

The capping layer 520 may have a stacked structure in which at least one low refractive layer and at least one high refractive layer are alternately stacked. Each of the at least one low refractive layer and the at least one high refractive layer of the capping layer 520 may include an inorganic layer. For example, the capping layer 520 may have a stacked structure in which inorganic layers having different refractive indices are alternately stacked.

The capping layer 520 may include a first low refractive layer 521, a first high refractive layer 522, and a second low refractive layer 523 that are sequentially stacked. As described above, each of the at least one low refractive layer and the at least one high refractive layer of the capping layer 520 may include an inorganic layer. Accordingly, the first low refractive layer 521 may also be referred to as a first inorganic layer 521, the first high refractive layer 522 may also be referred to as a second inorganic layer 522, and the second low refractive layer 523 may also be referred to as a third inorganic layer 523. For example, the first low refractive layer 521 may be the same as the first inorganic layer 521, the first high refractive layer 522 may be the same as the second inorganic layer 522, and the second low refractive layer 523 may be the same as the third inorganic layer 523. Each of the reference numerals 521, 522, and 523 refers to the different element names for the convenience of description and explanation thereof. A refractive index of the first inorganic layer 521 and the third inorganic layer 523 may be smaller than a refractive index of the second inorganic layer 522.

The first low refractive layer 521 may be disposed on the light emitting element ED and the contact electrodes 700. The first low refractive layer 521 may be disposed on the light emitting element ED and surround an outer surface of the light emitting element ED.

The first low refractive layer 521 may include a first region 521_1 and a second region 521_2 based on an arrangement position thereof.

The first region 521_1 of the first low refractive layer 521 may be disposed on the contact electrodes 700 and/or the light emitting element ED. The first region 521_1 of the first low refractive layer 521 may cover top surfaces of the contact electrodes 700 and the outer surface of the light emitting element ED, which is exposed through a space formed between the contact electrodes 700.

The second region 521_2 of the first low refractive layer 521 may be interposed between the light emitting element ED and the first insulating layer 510. The second region 521_2 of the first low refractive layer 521 may be disposed in the separation space SMA to fill the separation space SMA. The second region 521_2 of the first low refractive layer 521 may be in electrical and physical contact with a portion of the outer surface of the light emitting element ED. For example, the second region 521_2 of the first low refractive layer 521 may be disposed under the light emitting element ED, and may be in electrical and physical contact with a lower surface of the light emitting element ED.

As shown in FIG. 6, which is a cross-section of a portion between the first electrode 210 (refer to FIG. 5) and the second electrode 220 (refer to FIG. 5) in the second direction DR2, the first low refractive layer 521 may be formed to entirely surround the outer surface of the light emitting element ED.

The first low refractive layer 521 may include an inorganic insulating material. The inorganic insulating material of the first low refractive layer 521 may have a relatively small refractive index. The refractive index of the first low refractive layer 521 may be in a range of about 1.3 to about 1.6. For example, the first low refractive layer 521 may include silicon oxide (SiOx) or silicon oxycarbide (SiOCx). The first low refractive layer 521 may be formed by chemical vapor deposition (CVD).

In case that the first low refractive layer 521 includes silicon oxide (SiOx) or silicon oxycarbide (SiOCx), the first low refractive layer 521 may have a lower hardness and physical properties closer to an organic material than a high refractive layer. Further description of the high refractive layer is provided below with reference to the drawings. Therefore, the first low refractive layer 521 may also be used to fill the separation space SMA between the first insulating layer 510 and the light emitting element ED, although the first low refractive layer 521 includes the inorganic material. The inorganic material may be filled in the separation space SMA in the step of forming the first low refractive layer 521. Accordingly, the first low refractive layer 521 may efficiently seal the light emitting element layer without leaving an empty space.

The first high refractive layer 522 may be disposed on the first low refractive layer 521. The first low refractive layer 521 may prevent the permeation of oxygen or moisture into the light emitting element layer together with the first high refractive layer 522.

The first high refractive layer 522 may entirely cover the first low refractive layer 521 disposed thereunder. The first high refractive layer 522 may seal the first low refractive layer 521. As described above, the first low refractive layer 521 entirely seals the light emitting element ED and the contact electrodes 700 disposed thereunder without an empty space. Thus, the first high refractive layer 522, which is disposed on the first low refractive layer 521, may entirely seal the light emitting element layer thereunder without discontinuation.

The first high refractive layer 522 may have a refractive index greater than those of the first low refractive layer 521 and the second low refractive layer 523. Further description of the first low refractive layer 521 and the second low refractive layer 523 is provided below with reference to the drawings. For example, the refractive index of the first high refractive layer 522 may be in a range of about 1.7 to about 2.4. For example, the refractive index of the first high refractive layer 522 may be in a range of about 1.7 to about 2.2.

The first high refractive layer 522 may include an inorganic insulating material. For example, the first high refractive layer 522 may include silicon nitride (SiNx), but is not limited thereto. The first high refractive layer 522 may be formed by atomic layer deposition (ALD). Accordingly, a sealing property of the first high refractive layer 522 may be superior to that of the first low refractive layer 521 which is formed by the chemical vapor deposition (CVD). Also, since the capping layer 520 is formed by both of the atomic layer deposition (ALD) and the chemical vapor deposition (CVD), the sealing property of the capping layer 520 may be improved. The hybrid method for forming the capping layer 520 using at least one atomic layer deposition (ALD) and at least one chemical vapor deposition (CVD) refers to "hybrid layer deposition (HLD)".

The second low refractive layer 523 may be disposed on the first high refractive layer 522. The second low refractive layer 523 may prevent the permeation of oxygen or moisture into the light emitting element layer together with first low refractive layer 521 and the first high refractive layer 522.

The second low refractive layer 523 may entirely cover the first high refractive layer 522 disposed thereunder. The second low refractive layer 523 may seal the first high refractive layer 522.

As described above, the refractive index of the second low refractive layer 523 may be smaller than that of the first high refractive layer 522. For example, the refractive index of the second low refractive layer 523 may be in a range of about 1.3 to about 1.6.

The second low refractive layer 523 may include an inorganic insulating material. For example, the second low refractive layer 523 may include silicon oxide (SiOx), but is not limited thereto. The second low refractive layer 523 may be formed by chemical vapor deposition (CVD).

The first low refractive layer 521, which is the lowermost layer among the layers of the capping layer 520 in a downward direction (i.e., an opposite direction to a third direction DR3), may have a thickness d1 greater than thicknesses of other inorganic layers disposed on the first low refractive layer 521. The thickness d1 of the first low refractive layer 521 may be greater than a thickness d2 of the first high refractive layer 522. Further, the thickness d1 of the first low refractive layer 521 may be greater than a thickness d3 of the second low refractive layer 523. The thickness d1 of the first low refractive layer 521 may be about 1.5 times to about 20 times greater than the thickness d2 of the first high refractive layer 522 and/or the thickness d3 of the second low refractive layer 523. For example, the thickness d1 of the first low refractive layer 521 may be about 450 Å or greater, and the thickness d2 of the first high refractive layer 522 and the thickness d3 of the second low refractive layer 523 may be about 300 Å or greater, but the thicknesses d1, d2, and d3 of the first low refractive layer 521, the first high refractive layer 522, and the second low refractive layer 523 may have various thicknesses and the embodiments are not limited thereto.

The thickness d1 of the first low refractive layer 521 may be greater than a thickness W (or a diameter or width) of the light emitting element ED. Since the thickness d1 of the first low refractive layer 521 is greater than the thickness W (or the diameter or width) of the light emitting element ED, the light emitting element ED may be stably fixed on the first insulating layer 510 by the first low refractive layer 521. Further, although the first low refractive layer 521 is an inorganic layer, the first low refractive layer 521 may have the low refractive index. Accordingly, the first low refractive layer 521 may have physical properties close to an organic material and may efficiently surround the outer surface of the light emitting element ED. Therefore, the capping layer 520 including the first low refractive layer 521 may efficiently delay moisture permeation therethrough.

Since the capping layer 520 covers the light emitting element ED by laminating the first low refractive layer 521, the first high refractive layer 522, and the second low refractive layer 523 on the light emitting element ED, the lights emitted from the ends of the light emitting element ED may be guided upwardly by the capping layer 520. For example, the lights emitted from the light emitting element ED may be focused in the upward direction (i.e., the third direction DR3) by the capping layer 520. The lights emitted through the end surfaces of the light emitting element ED may proceed to the capping layer 520 in which the low refractive layer and the high refractive layer are alternately stacked. Some of the lights incident on the capping layer 520 may be reflected and some others may be transmitted. In case that the low refractive layer and the high refractive layer, which include an inorganic material, are alternately stacked in the capping layer 520, most of the lights incident on the capping layer 520 may be reflected. Accordingly, the lights emitted to the left and right through the end surfaces of the light emitting element ED may be guided upwardly by the capping layer 520, thereby increasing the luminance of the display device 10 (refer to FIG. 1). Further, as described above, the element active layer 33 emitting the light is biased to one side, and thus the intensity of the light emitted from the light emitting element ED may be asymmetric. However, the lights emitted from the end surfaces of the light emitting element ED may be guided upwardly by the capping layer 520, thereby preventing asymmetric light emission in a plan view. For example, the lights emitted from the light emitting element ED may be focused in the upward direction (i.e., the third direction DR3) by the capping layer 520.

Figure 7:
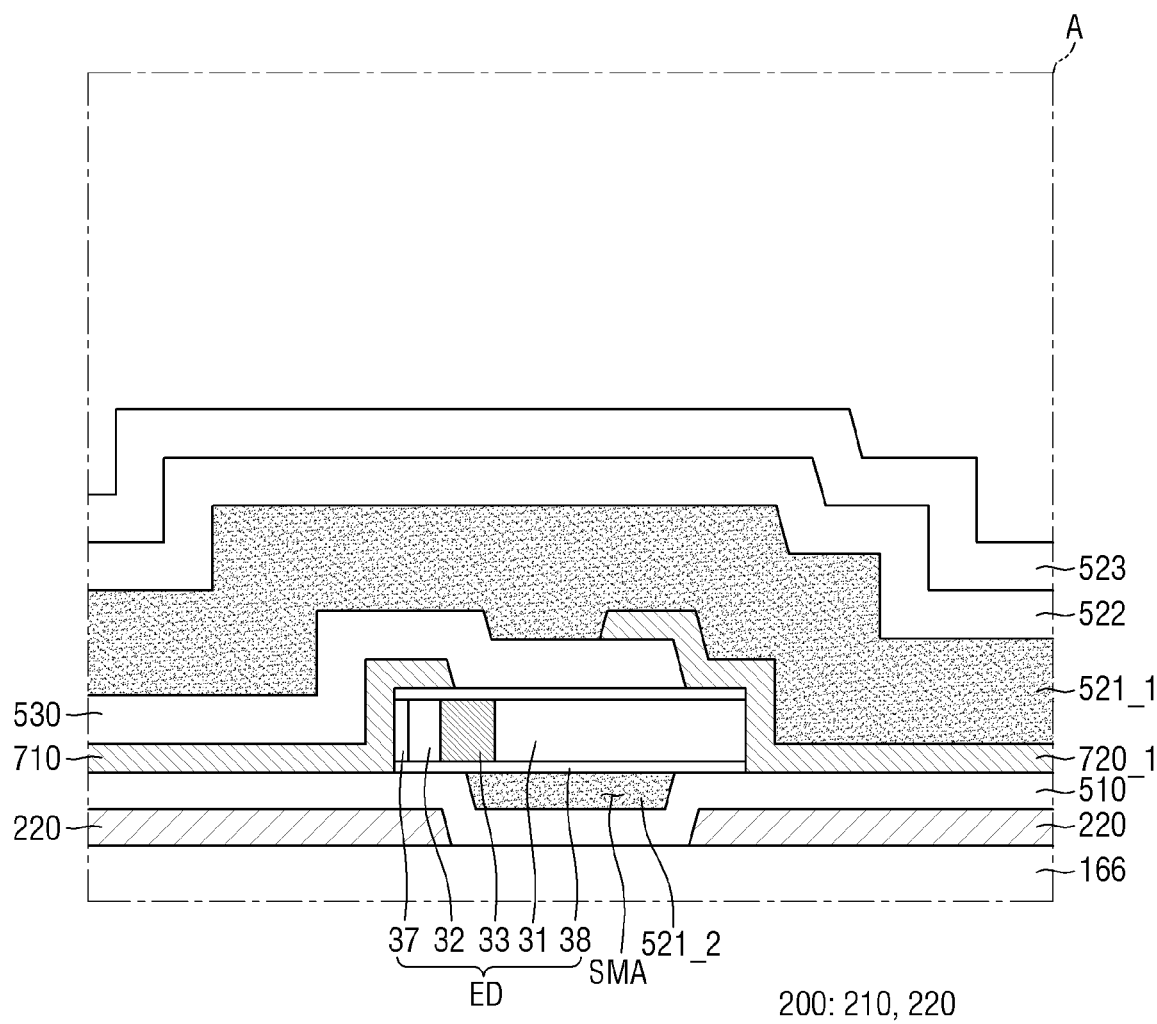
FIG. 7 is an enlarged cross-sectional view illustrating area A of FIG. 3 according to an embodiment.

FIG. 7 is an enlarged cross-sectional view illustrating area A of FIG. 3 according to an embodiment.

Referring to FIG. 7, the display device 10 (refer to FIG. 1) according to the embodiment is different from the embodiment of FIG. 5 in that the first contact electrode 710 and a second contact electrode 720_1 are formed at different layers, and a second insulating layer 530 covering the first contact electrode 710 is further included. Thus, detailed description of the same constituent elements (e.g. the via layer 166 and the separation space SMA) is omitted.

Contact electrodes 700_1 may include the first contact electrode 710 and the second contact electrode 720_1 that are formed at different layers from each other in a cross-sectional view. The contact electrodes 700_1 may be spaced apart from each other in a plan view.

The first contact electrode 710 may be disposed above the first electrode 210 and may be in electrical and physical contact with one end of the light emitting element ED. The first contact electrode 710 may cover the end of the light emitting element ED, and may expose the other end of the light emitting element ED.

The second insulating layer 530 may be disposed on the first contact electrode 710. The second insulating layer 530 may entirely cover the first contact electrode 710. The second insulating layer 530 may cover the first contact electrode 710, and may expose the other end of the light emitting element ED. The second insulating layer 530 may be disposed between the first contact electrode 710 and the second contact electrode 720_1 to insulate them from each other.

The second insulating layer 530 may include an inorganic insulating material. For example, the second insulating layer 530 may include at least one inorganic insulating material of silicon oxide (SiOx), silicon nitride (SiNx), and silicon oxynitride (SiOxNy). The thickness of the second insulating layer 530 may be about 300 Å or greater, but the second insulating layer 530 may have various thicknesses and the embodiments are not limited thereto.

The second contact electrode 720_1 may be disposed on the second insulating layer 530. The second contact electrode 720_1 may be disposed above the second electrode 220 and may be in electrical and physical contact with the other end of the light emitting element ED. The second contact electrode 720_1 may be in electrical and physical contact with the other end of the light emitting element ED. The other end of the light emitting element ED may be exposed by the second insulating layer 530. The second contact electrode 720_1 may extend from the other end of the light emitting element ED toward an opposite direction to the end of the light emitting element ED. The second contact electrode 720_1 may partially overlap the top surface of the second insulating layer 530. For example, the second contact electrode 720_1 may partially cover the top surface of the second insulating layer 530.

In the embodiment, the second insulating layer 530 may be disposed on the first contact electrode 710, and the second contact electrode 720_1 may be disposed on the second insulating layer 530. For example, the first contact electrode 710 and the second contact electrode 720_1 may be formed from different layers. Since a step for manufacturing the display device 10 (refer to FIG. 1) is added, the efficiency in the manufacturing process of the display device 10 (refer to FIG. 1) may be decreased. However, in case that the first contact electrode 710 and the second contact electrode 720_1 are formed from the different layers, electrical disconnection or short-circuit between the first contact electrode 710 and the second contact electrode 720_1 may be minimized in the manufacturing process of the display device 10 (refer to FIG. 1). Thus, yield of the display device 10 (refer to FIG. 1) may be improved.

Figure 8:
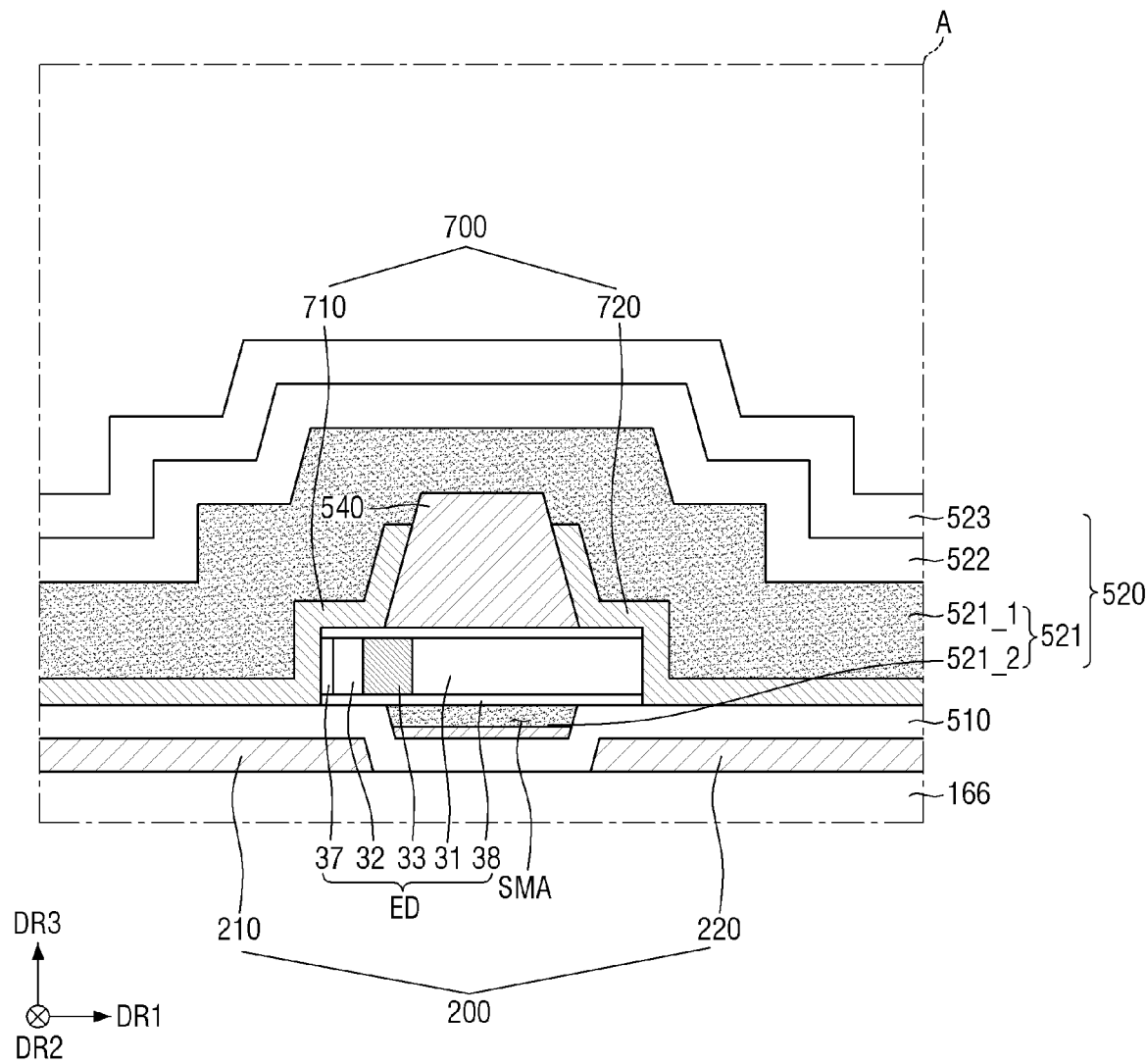
FIG. 8 is an enlarged cross-sectional view showing area A of FIG. 3 according to an embodiment.

FIG. 8 is an enlarged cross-sectional view showing area A of FIG. 3 according to an embodiment.

Referring to FIG. 8, the display device 10 (refer to FIG. 1) according to the embodiment is different from the embodiment of FIG. 5 in that a third insulating layer 540 is further disposed on the light emitting element ED, and the contact electrodes 700 is disposed on the third insulating layer 540. Thus, detailed description of the same constituent elements (e.g. the via layer 166) is omitted.

Referring to FIGS. 2, 3, and 8, the third insulating layer 540 may be disposed on the light emitting elements ED in the emission area EMA. A portion of the third insulating layer 540 may overlap a portion of the light emitting elements ED in the third direction DR3 in the emission area EMA. For example, the third insulating layer 540 may partially cover the light emitting elements ED in the third direction DR3 in the emission area EMA. A remaining portion of the third insulating layer 540 may be disposed on a lower member exposed by the light emitting elements ED. For example, the lower member exposed by the light emitting elements ED may include the first insulating layer 510 or a second region 512_2 of the first low refractive layer 521.

The overlapped portion of the third insulating layer 540 may be formed on the light emitting elements ED to partially surround the outer surfaces of the light emitting elements ED. Since the third insulating layer 540 surrounds the outer surfaces of the light emitting elements ED, the light emitting elements ED spaced apart from each other may be fixed on the first insulating layer 510. For example, the third insulating layer 540 may hold the light emitting elements ED on the first insulating layer 510.

The third insulating layer 540 may expose ends of the light emitting elements ED. A width of the third insulating layer 540 may be smaller than a length of the light emitting element ED. The third insulating layer 540 may include an organic insulating material such as polyimide (PI).

As described above, the first insulating layer 510 may have a stepped portion between the first electrode 210 and the second electrode 220 due to the stepped profile of the first electrode 210 and the second electrode 220. Accordingly, the separation space SMA may be formed between the light emitting element ED and the top surface of the first insulating layer 510, which is partially recessed between the first electrode 210 and the second electrode 220. A material 541 including the same material as the third insulating layer 540 may fill at least a portion of the separation space SMA. For example, the material 541 and the third insulating layer 540 may be formed from the same process such as coating, depositing, or a combination thereof.

The contact electrodes 700 may be disposed on the third insulating layer 540. Each of the first contact electrode 710 and the second contact electrode 720 may be disposed on the third insulating layer 540. The first contact electrode 710 and the second contact electrode 720 may be spaced apart from each other, and the third insulating layer 540 may be interposed between the first contact electrode 710 and the second contact electrode 720. The first contact electrode 710 and the second contact electrode 720 are disposed on the side surface of the third insulating layer 540. The first contact electrode 710 and the second contact electrode 720 may not be disposed on the top surface of the third insulating layer 540. However, the embodiments are not limited thereto. For example, the first contact electrode 710 and the second contact electrode 720 may also be disposed on a portion of the top surface of the third insulating layer 540, and end portions of the first contact electrode 710 and the second contact electrode 720 may be spaced apart from each other on the top surface of the third insulating layer 540.

The first low refractive layer 521 may be disposed on the contact electrodes 700 and the third insulating layer 540. The first low refractive layer 521 may include the first region 521_1 disposed above the first insulating layer 510 and the light emitting element ED, and the second region 521_2 interposed between the first insulating layer 510 and the light emitting element ED. The first region 521_1 and the second region 521_2 may interpose the light emitting element ED.

The first region 521_1 of the first low refractive layer 521 may cover the contact electrodes 700 and the third insulating layer 540. The first region 521_1 of the first low refractive layer 521 may be in electrical and physical contact with the outer surface of the third insulating layer 540 exposed by the contact electrodes 700.

The second region 521_2 of the first low refractive layer 521 may be disposed in the separation space SMA. In the separation space SMA, the second region 521_2 of the first low refractive layer 521 may be disposed on the material 541 including the same material as the third insulating layer 540.

In a manufacturing process of the display device 10 (refer to FIG. 1), the third insulating layer 540 is firstly formed on the light emitting element ED before the contact electrodes 700 are formed. Thus, the light emitting elements ED may be aligned and fixed between the first electrode 210 and the second electrode 220 by the third insulating layer 540. Thus, the third insulating layer 540 may hold the light emitting elements ED at alignment positions between the first electrode 210 and the second electrode 220, although the contact electrodes 700 are not formed yet. Accordingly, dislocation of the light emitting elements ED may be prevented in subsequent processes, so that the reliability in the manufacturing process of the display device 10 (refer to FIG. 1) may be improved.

Figure 9:
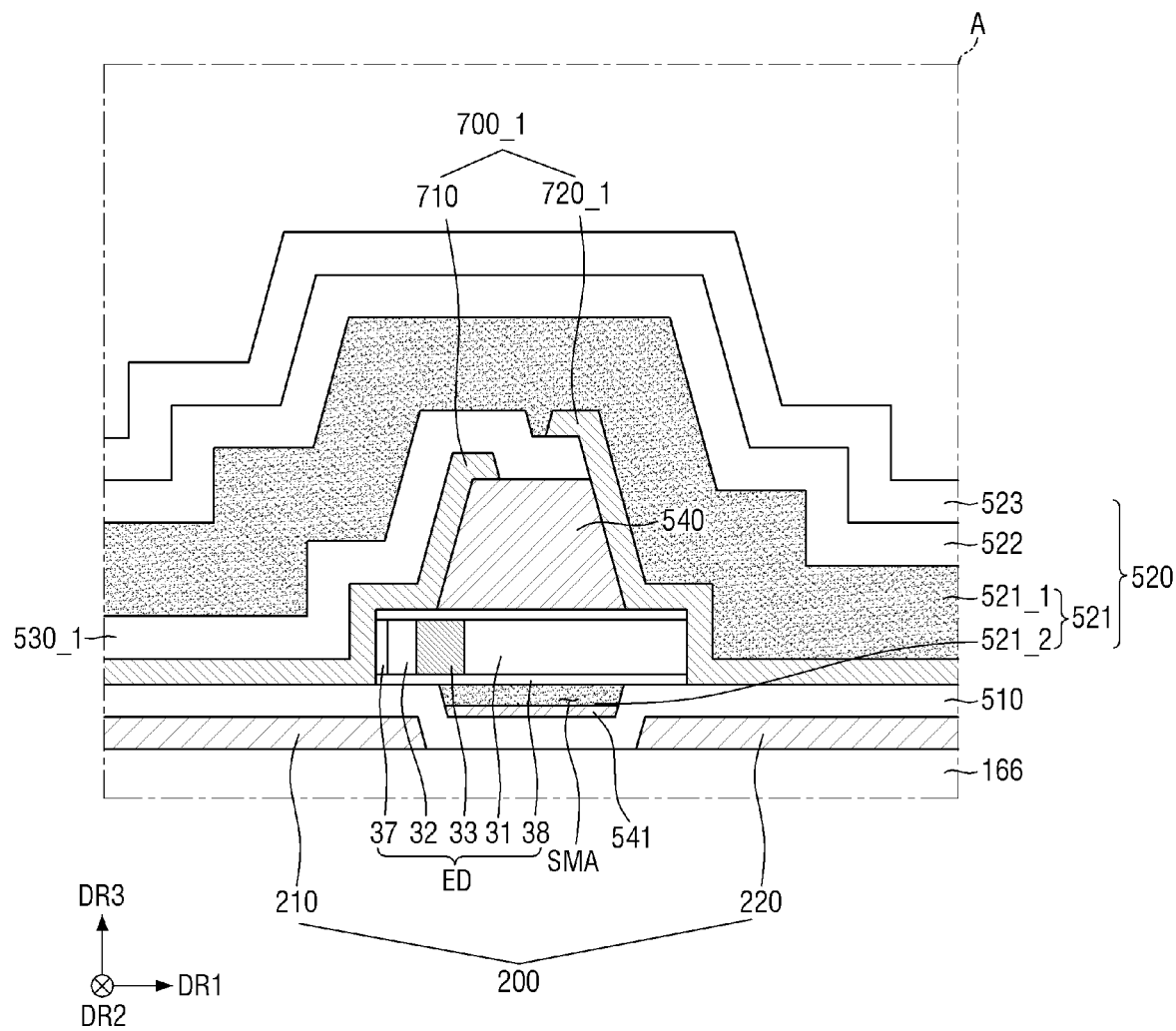
FIG. 9 is an enlarged cross-sectional view showing area A of FIG. 3 according to an embodiment.

FIG. 9 is an enlarged cross-sectional view showing area A of FIG. 3 according to an embodiment.

Referring to FIG. 9, the display device 10 (refer to FIG. 1) according to the embodiment is different from the embodiment of FIG. 8 in that the first contact electrode 710 and the second contact electrode 720_1 are formed at different layers, and the display device 10 (refer to FIG. 1) further includes a second insulating layer 530_1, which covers the top surfaces of the first contact electrode 710 and the insulating layer 540. Thus, detailed description of the same constituent elements (e.g. the via layer 166 and the separation space SMA) is omitted.

The first contact electrode 710 may be disposed on the first electrode 210 and one end of the light emitting element ED. The first contact electrode 710 may extend from the end of the light emitting element ED toward the third insulating layer 540, and may be also disposed on one side surface and a portion of a top surface of the third insulating layer 540. The first contact electrode 710 may be disposed on the portion of the top surface of the third insulating layer 540, and a remaining portion of the top surface of the third insulating layer 540 may be exposed.

The second insulating layer 530_1 may be disposed on the first contact electrode 710. The second insulating layer 530_1 may entirely cover the first contact electrode 710. The second insulating layer 530_1 may be disposed on the one side surface and the portion of the top surface of the third insulating layer 540. The second insulating layer 530_1 may entirely cover the one side surface and the portion of the top surface of the third insulating layer 540. One end of the second insulating layer 530_1 may be aligned to be parallel with the other side surface of the third insulating layer 540.

The second contact electrode 720_1 may be disposed on the second electrode 220 and the other end of the light emitting element ED. The second contact electrode 720_1 may extend from the other end of the light emitting element ED toward the third insulating layer 540, and may be also disposed on the other side surface of the third insulating layer 540 and a portion of the top surface of the second insulating layer 530_1.

In the embodiment, the third insulating layer 540 is disposed on the light emitting element ED, the first contact electrode 710 and the second contact electrode 720_1 are formed at different layers, and a portion of the second insulating layer 530_1 is formed between the first contact electrode 710 and the second contact electrode 720_1. Therefore, processes for forming the third insulating layer 540 and the contact electrodes 700_1 may be added for manufacturing the display device 10 (refer to FIG. 1), and the efficiency in the manufacturing process of the display device 10 (refer to FIG. 1) may be decreased. However, the reliability of the display device 10 (refer to FIG. 1) may be improved. The third insulating layer 540 may further be disposed on the light emitting element ED to hold the light emitting elements ED at alignment positions between the first electrode 210 and the second electrode 220, and thus, dislocation of the light emitting element ED may be prevented in subsequent processes. The first contact electrode 710 and the second contact electrode 720_1 are formed from the different layers and the second insulating layer 530_1 is interposed between the first contact electrode 710 and the second contact electrode 720_1, and thus, electrical disconnection or short-circuit between the first contact electrode 710 and the second contact electrode 720_1 may be minimized in the manufacturing process of the display device 10 (refer to FIG. 1).

Figure 10:
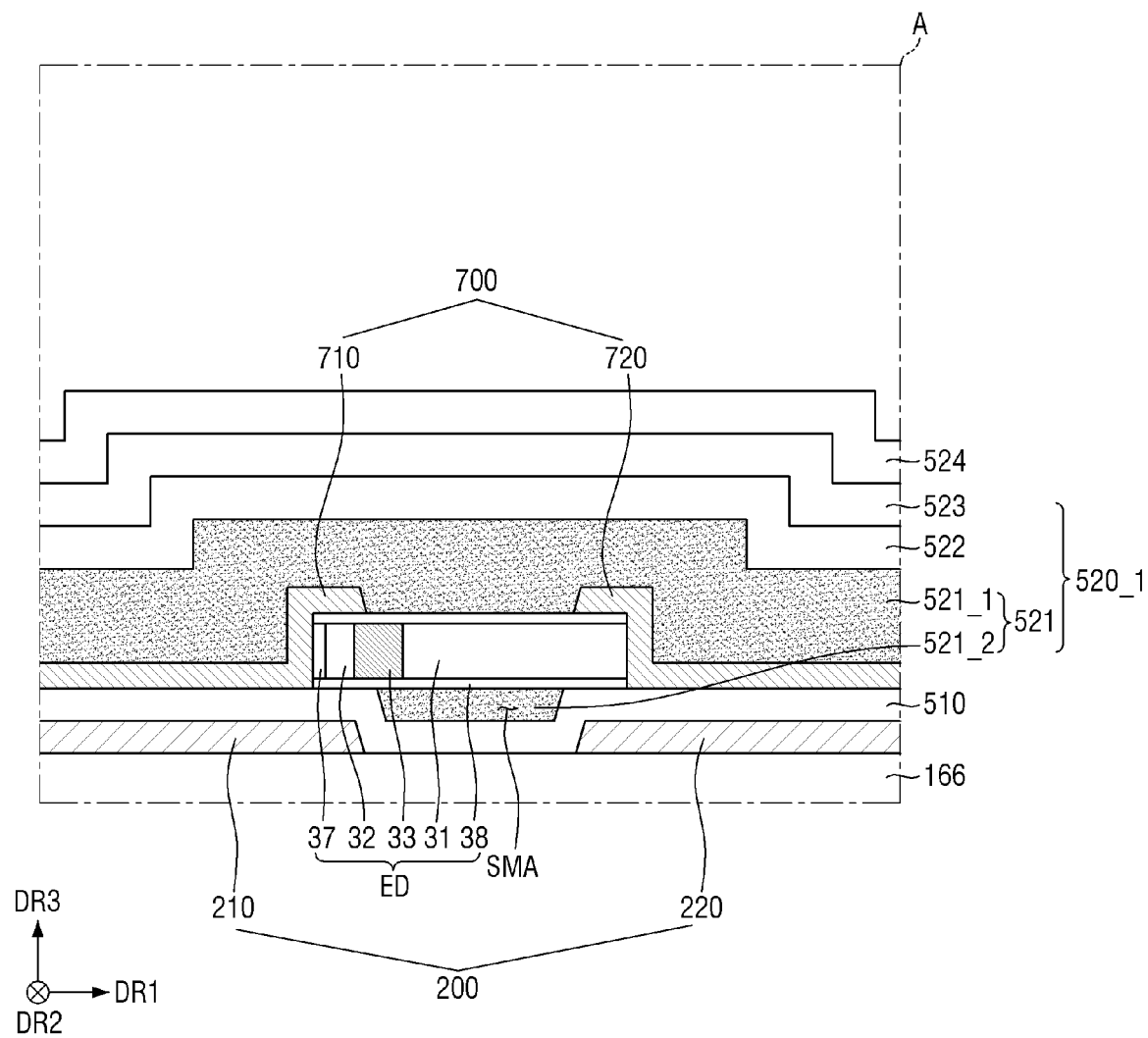
FIG. 10 is an enlarged cross-sectional view showing area A of FIG. 3 according to an embodiment.

FIG. 10 is an enlarged cross-sectional view showing area A of FIG. 3 according to an embodiment.

Referring to FIG. 10, the display device 10 (refer to FIG. 1) according to the embodiment is different from the embodiment of FIG. 5 in that the capping layer 520_1 further includes a second high refractive layer 524 disposed on the second low refractive layer 523. Thus, detailed description of the same constituent elements (e.g. the via layer 166, the electrode layer 200, the light emitting element ED, the separation space SMA, and the contact electrodes 700) is omitted.

As described above, the capping layer 520_1 may have a structure in which the low refractive layers 521 and 523 and the high refractive layers 522 and 524 having different refractive indices are alternately stacked. The capping layer 520_1 may further include the second high refractive layer 524 disposed on the second low refractive layer 523. The second high refractive layer 524 may prevent the permeation of oxygen or moisture into the light emitting element layer together with the first and second low refractive layers 521 and 523, and the first high refractive layer 522.

The second high refractive layer 524 may entirely cover the second low refractive layer 523 disposed thereunder. The second high refractive layer 524 may seal the first low refractive layer 521, the first high refractive layer 522, and the second low refractive layer 523. The second high refractive layer 524 may have a refractive index greater than those of the first and second low refractive layers 521 and 523. For example, the refractive index of the second high refractive layer 524 may be in a range of about 1.7 to about 2.4. For example, the refractive index of the second high refractive layer 524 may be in a range of about 1.7 to about 2.2.

The second high refractive layer 524 may include an inorganic insulating material. The second high refractive layer 524 may include the same material as the first high refractive layer 522. For example, the second high refractive layer 524 may include silicon nitride (SiNx). However, it should be noted that the material of the second high refractive layer 524 is not limited thereto. The refractive index of the second high refractive layer 524 may be greater than that of the second low refractive layer 523 disposed thereunder, and may include a material different from that of the first high refractive layer 522. In the embodiment, the second high refractive layer 524 including an inorganic insulating material may be the same as a fourth inorganic layer 524. The reference numeral 524 refers to the different element names.

The second high refractive layer 524 may have a thickness smaller than that of the first low refractive layer 521, which is the lowermost layer among the layers of the capping layer 520_1 in a downward direction (i.e., an opposite direction to a third direction DR3). Thicknesses of the first low refractive layer 521 may be about 1.5 times to about 20 times greater than the thickness of the second high refractive layer 524. For example, the thickness of the second high refractive layer 524 may be about 300 Å or greater, but the first low refractive layer 521 may have various thickness and the embodiments are not limited thereto.

In the embodiment, the capping layer 520_1, which covers the members disposed thereunder, may further include the second high refractive layer 524 at the uppermost layer thereof in an upward direction (i.e., the third direction DR3), and thus, sealing property of the capping layer 520_1 may be improved. The second high refractive layer 524 may include an inorganic insulating material having a higher refractive index than that of the second low refractive layer 523, and may be formed by atomic layer deposition (ALD). Thus, the second high refractive layer 524 may have a sealing property superior to that of the second low refractive layer 523 formed by chemical vapor deposition (CVD). Also, since the capping layer 520_1 is formed by both of the atomic layer deposition (ALD) and the chemical vapor deposition (CVD), the sealing property of the capping layer 520_1 may be greatly improved. For example, the capping layer 520_1 may be formed by a hybrid layer deposition (HLD) including multiple atomic layer depositions (ALD) and multiple chemical vapor depositions (CVD). The display device 10 (refer to FIG. 1) may further include the second high refractive layer 524, which has a sealing property superior to that of the second low refractive layer 523, at the uppermost layer of the capping layer 520_1 in the upward direction (i.e., the third direction DR3), and thus, the moisture permeation of the capping layer 520_1 may be efficiently delayed. Thus, defect caused by the moisture permeation may be prevented, and the lifetime of the display device 10 (refer to FIG. 1) may be increased.

Figure 11:
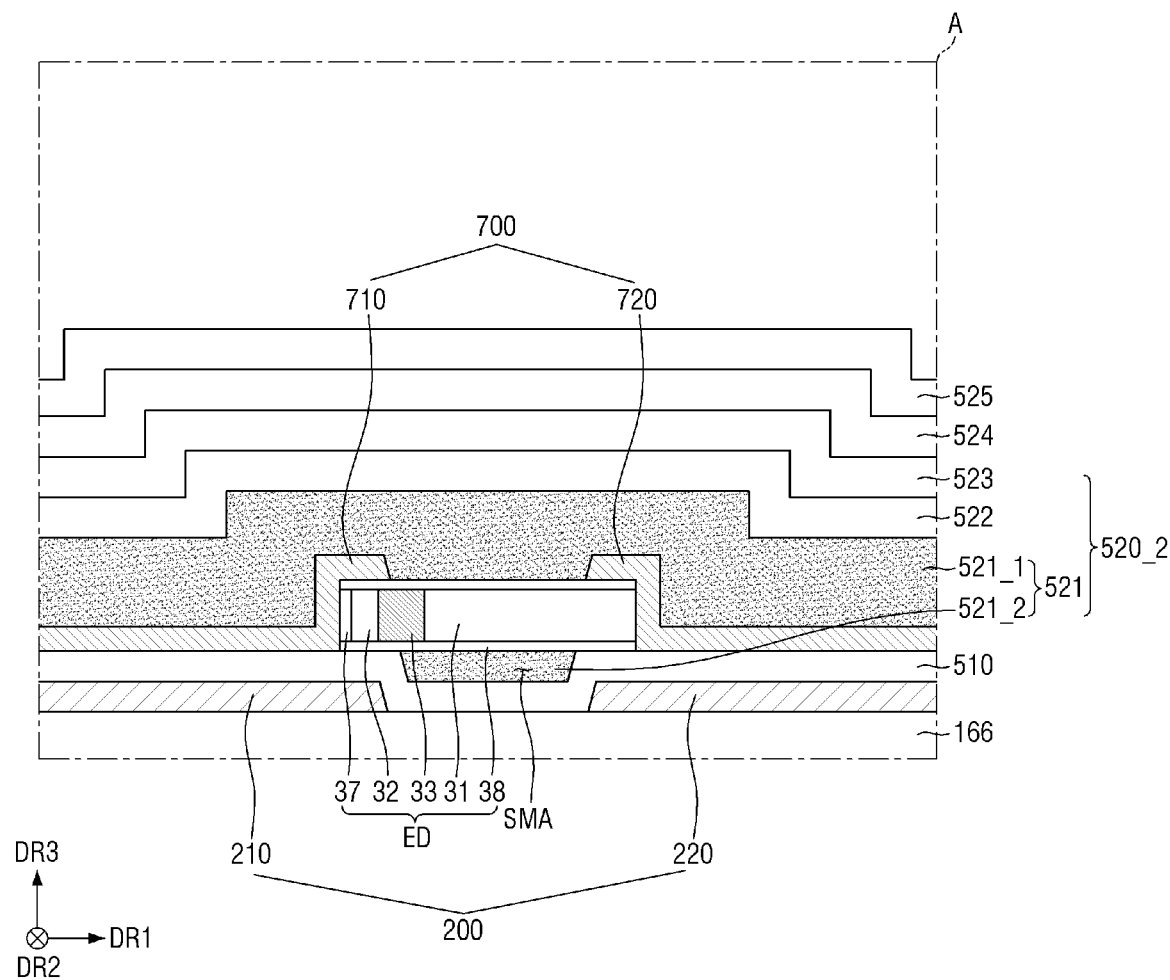
FIG. 11 is an enlarged cross-sectional view showing area A of FIG. 3 according to an embodiment.

FIG. 11 is an enlarged cross-sectional view showing area A of FIG. 3 according to an embodiment.

Referring to FIG. 11, the display device 10 (refer to FIG. 1) according to the embodiment is different from the embodiment of FIG. 10 in that a capping layer 520_2 further includes a third low refractive layer 525 disposed on the second high refractive layer 524. Thus, detailed description of the same constituent elements (e.g. the via layer 166, the electrode layer 200, the light emitting element ED, the separation space SMA, and the contact electrodes 700) is omitted.

The capping layer 520_2 may further include the third low refractive layer 525 disposed on the second high refractive layer 524. The third low refractive layer 525 may prevent the permeation of oxygen or moisture into the light emitting element layer together with the first and second low refractive layers 521 and 523 and the first and second high refractive layers 522 and 524. The third low refractive layer 525 may also adjust a direction of light irradiation together with the first and second low refractive layers 521 and 523 and the first and second high refractive layers 522 and 524, so that the light emitted from the light emitting element ED may be guided in an upward direction of the light emitting element ED. For example, the lights emitted from the light emitting element ED may be focused in the upward direction (i.e., the third direction DR3) by the assistance of the third low refractive layer 525.

The third low refractive layer 525 may entirely cover the second high refractive layer 524 disposed thereunder. The third low refractive layer 525 may seal the first low refractive layer 521, the first high refractive layer 522, the second low refractive layer 523, and the second high refractive layer 524. The third low refractive layer 525 may have a refractive index smaller than the refractive indices of the first and second high refractive layers 522 and 524. For example, the refractive index of the third low refractive layer 525 may be in a range of about 1.3 to about 1.6.

The third low refractive layer 525 may include an inorganic insulating material. The third low refractive layer 525 may include the same material as the second low refractive layer 523. For example, the third low refractive layer 525 may include silicon oxide (SiOx). However, the embodiments are not limited thereto, and the third low refractive layer 525 may include a material different from the second low refractive layer 523. In the embodiment, the third low refractive layer 525 including an inorganic insulating material may also be referred to as a fifth inorganic layer 525.

The third low refractive layer 525 may have a thickness smaller than that of the first low refractive layer 521 which is the lowermost layer among the layers of the capping layer 520_2 in a downward direction (i.e., an opposite direction to a third direction DR3). The thickness of the first low refractive layer 521 may be about 1.5 times to about 20 times greater than the thickness of the third low refractive layer 525.

In the embodiment, the capping layer 520_2 may further include the third low refractive layer 525 at the uppermost layer thereof in an upward direction (i.e., the third direction DR3), and thus, the emission efficiency of light, which is emitted from the light emitting element ED in a display direction (i.e., the upward direction or the third direction DR3) of the display device 10 (refer to FIG. 1), may be improved. The third low refractive layer 525 having a low refractive index may be interposed between the outside of the light emitting element layer and the second high refractive layer 524, thereby preventing total reflection of light irradiated from the light emitting element ED in the upward direction. Thus, the luminance of the display device 10 (refer to FIG. 1) may be increased.

Figure 12:
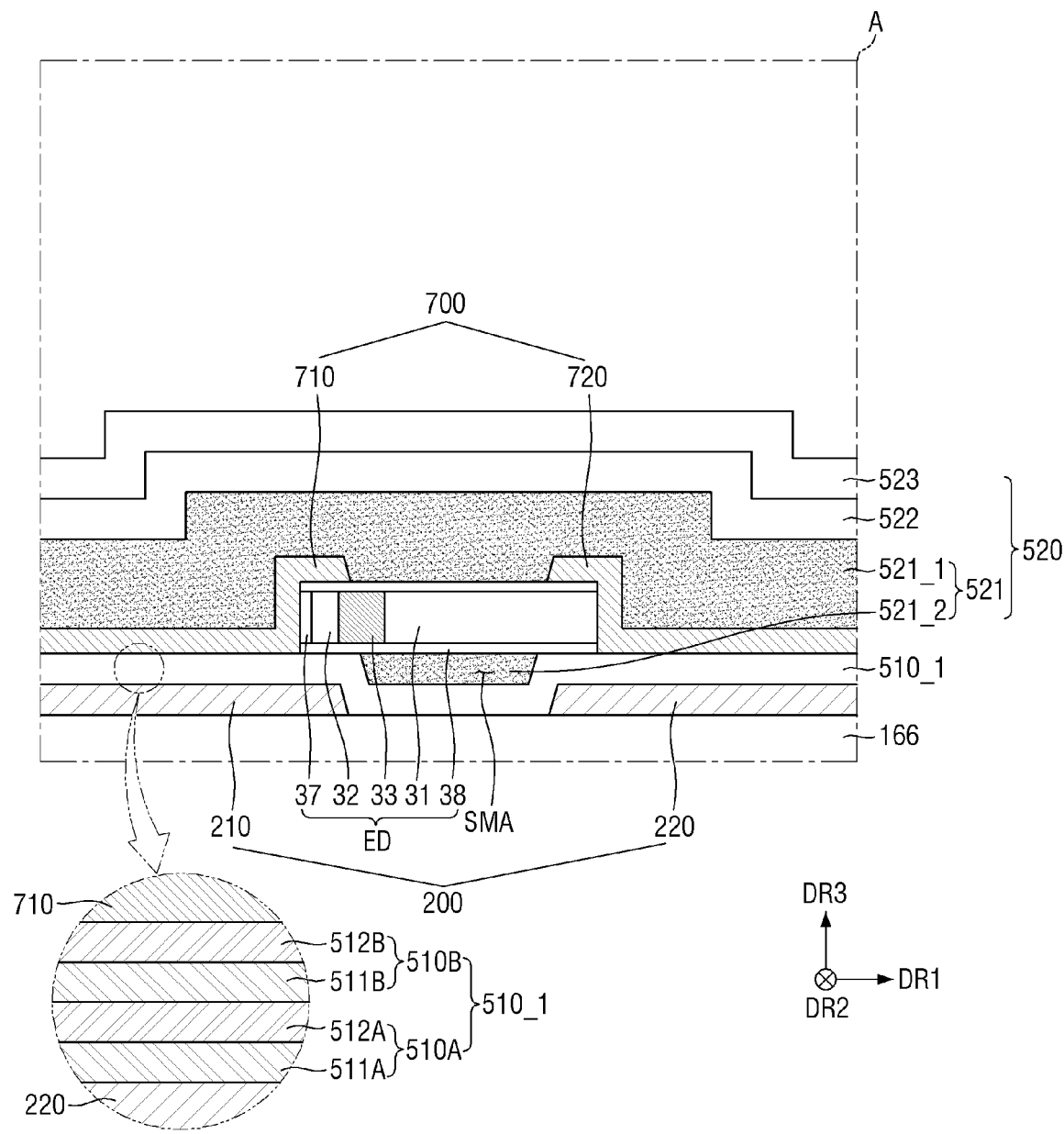
FIG. 12 is an enlarged cross-sectional view showing of area A of FIG. 3 according to an embodiment.

FIG. 12 is an enlarged cross-sectional view showing area A of FIG. 3 according to an embodiment.

Referring to FIG. 12, the display device 10 (refer to FIG. 1) according to the embodiment is different from the embodiment of FIG. 5 in that a first insulating layer 510_1 includes a distributed Bragg reflector (DBR) layer having a structure in which inorganic layers are stacked. Thus, detailed description of the same constituent elements (e.g. the via layer 166, the electrode layer 200, the light emitting element ED, the separation space SMA, and the contact electrodes 700) is omitted.

The first insulating layer 510_1 may have a structure in which optical layers are repeatedly stacked. The optical layers of the first insulating layer 510_1 may include inorganic layers having different refractive indices. For example, the first insulating layer 510_1 may include a distributed Bragg reflector (DBR) layer. Since the first insulating layer 510_1 includes the distributed Bragg reflector (DBR) layer, the light emitted from the light emitting element ED and incident into the first insulating layer 510_1 may be guided in a display direction (i.e., a third direction DR3) of the display device 10 (refer to FIG. 1).

In an embodiment, the first insulating layer 510_1 may include a first optical layer 510A and a second optical layer 510B.

The first optical layer 510A may be disposed on the electrode layer 210 and 220 and a portion of the via layer 166, which is exposed between the electrode layer 210 and 220. The first optical layer 510A may include a sixth inorganic layer 511A having a first refractive index and a seventh inorganic layer 512A having a second refractive index which is different from the first refractive index.

The sixth inorganic layer 511A may be disposed on the electrode layer 210 and 220 and the portion of the via layer 166 exposed between the electrode layer 210 and 220. The seventh inorganic layer 512A may be disposed on the sixth inorganic layer 511A of the first optical layer 510A.

The second optical layer 510B may be disposed on the first optical layer 510A. The second optical layer 510B may be disposed on the seventh inorganic layer 512A. The second optical layer 510B may include an eighth inorganic layer 511B having the first refractive index and a ninth inorganic layer 512B having the second refractive index which is different from the first refractive index. The sixth inorganic layer 511A and the eighth inorganic layer 511B may include the same material. The seventh inorganic layer 512A and the ninth inorganic layer 512B may include the same material.

For example, the first insulating layer 510_1 may have a structure in which a first 'A' inorganic layer 511 having the first refractive index and a second 'A' inorganic layer 512 having the second refractive index that is different from the first refractive index are alternately and repeatedly stacked.

In FIG. 12, the first insulating layer 510_1 includes the sixth to ninth inorganic layers 511A, 512A, 511B, and 512B. For example, the first insulating layer 510_1 includes two pairs of optical layers 510A and 510B. However, the embodiments are not limited thereto. For example, the first insulating layer 510_1 may include multiple pairs of optical layers. The first insulating layer 510_1 may include three or more inorganic layers, which have three or more different refractive indices, and the inorganic layers may be stacked to form a pair of optical layers.

The inorganic layers 511A, 512A, 511B, and 512B of the first insulating layer 510_1 may have a transparent insulating material. For example, the transparent insulating material of the inorganic layers 511A, 512A, 511B, and 512B may include at least one inorganic insulating material of silicon oxide (SiOx), silicon nitride (SiNx), and silicon oxynitride (SiOxNy). The first insulating layer 510_1 may protect the first electrode 210 and the second electrode 220, and may insulate the first electrode 210 from the second electrode 220. The first insulating layer 510_1 may guides the light emitted from the light emitting element ED in the upward direction (i.e., the third direction DR3) together with a capping layer 520. For example, the lights emitted from the light emitting element ED may be focused in the upward direction (i.e., the third direction DR3) by the assistance of the first insulating layer 510_1.

Figure 13:
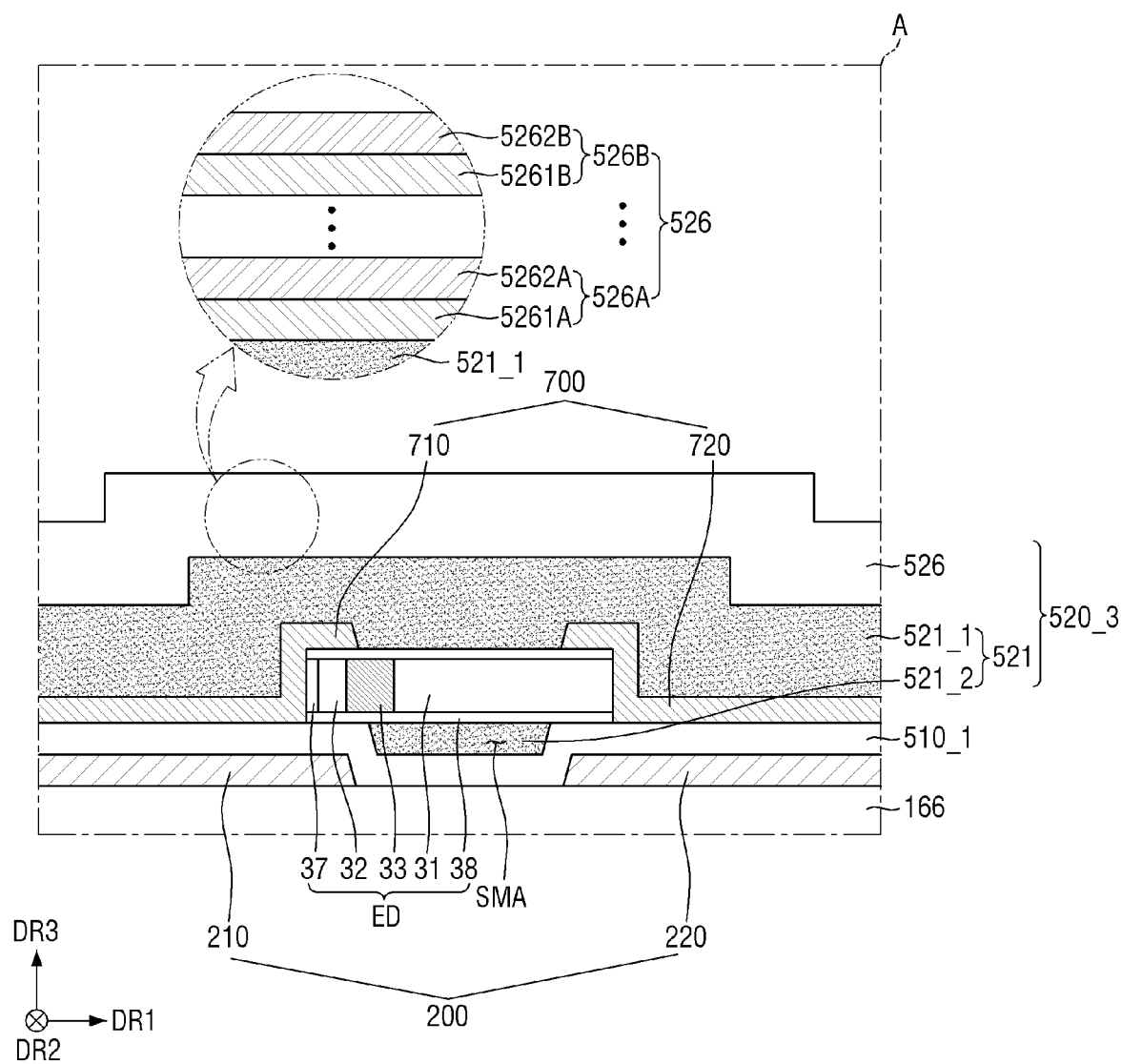
FIG. 13 is an enlarged cross-sectional view showing of area A of FIG. 3 according to an embodiment.

FIG. 13 is an enlarged cross-sectional view showing area A of FIG. 3 according to an embodiment.

Referring to FIG. 13, the display device 10 (refer to FIG. 1) according to the embodiment is different from the embodiment of FIG. 5 in that a capping layer 520_3 further includes a transmission filter layer 526 disposed on the first low refractive layer 521 and having a stacked structure including inorganic layers. Thus, detailed description of the same constituent elements (e.g. the via layer 166, the electrode layer 200, the light emitting element ED, the separation space SMA, and the contact electrodes 700) is omitted.

The capping layer 520_3 may include the first low refractive layer 521 and the transmission filter layer 526 disposed on the first low refractive layer 521.

The transmission filter layer 526 may entirely cover the first low refractive layer 521 disposed thereunder. The transmission filter layer 526 may seal the first low refractive layer 521. The transmission filter layer 526 may prevent the permeation of oxygen or moisture into the light emitting element layer together with the first low refractive layer 521. Further, the transmission filter layer 526 may control the reflection or transmission of the light emitted from the light emitting element ED, and may assist the light emitted from the light emitting element ED to be guided upwardly. For example, the lights emitted from the light emitting element ED may be focused in the upward direction (i.e., the third direction DR3) by the assistance of the transmission filter layer 526.

The transmission filter layer 526 may have a stacked structure including repeatedly stacked optical layers. Each of the stacked optical layers may include inorganic layers having different refractive indices. The transmission filter layer 526 may include a distributed Bragg reflector (DBR) layer.

The transmission filter layer 526 may have a multilayer structure including the optical layers 526A. Each of the optical layers 526A may be formed by stacking inorganic layers 5261A and 5262A having different refractive indices. In an embodiment, the transmission filter layer 526 may have a multilayer structure including the optical layers 526A. Each of the optical layers 526A may be formed by stacking the first layer 5261A having a third refractive index and the second layer 5262A having a fourth refractive index different from the third refractive index. For example, the transmission filter layer 526 may have a stacked structure including the first layer 5261A having the third refractive index and the second layer 5262A having the fourth refractive index. The first layer 5261A and the second layer 5262A may be alternately stacked to form the transmission filter layer 526.

The first layer 5261A may be disposed on the first low refractive layer 521. The first layer 5261A may entirely cover the first low refractive layer 521 disposed thereunder. The first layer 5261A may seal the first low refractive layer 521.

The first layer 5261A may have a refractive index greater than that of the first low refractive layer 521. For example, in case that the refractive index of the first low refractive layer 521 is in a range of about 1.3 to about 1.6, the refractive index of the first layer 5261A may be in a range of about 1.7 to about 2.4. For example, the refractive index of the first layer 5261A may be in a range of about 1.7 to about 2.2.

The second layer 5262A may be disposed on the first layer 5261A. The second layer 5262A may entirely cover the first layer 5261A disposed thereunder. The second layer 5262A may seal the first layer 5261A.

The second layer 5262A may have a refractive index different from the refractive index of the first layer 5261A. The refractive index of the second layer 5262A may be greater than that of the first layer 5261A. The refractive index of the second layer 5262A may be in a range of about 1.7 to about 2.4. For example, the refractive index of the second layer 5262A may be in a range of about 1.7 to about 2.2.

Each of the first and second layers 5261A and 5262A may have a thickness different from that of the first low refractive layer 521. The thickness of each of the first and second layers 5261A and 5262A may be smaller than the thickness of the first low refractive layer 521.

Each of the first and second layers 5261A and 5262A may include a transparent inorganic insulating material. Each of the first and second layers 5261A and 5262A may include at least one inorganic insulating material of silicon oxide (SiOx), silicon nitride (SiNx), and silicon oxynitride (SiOxNy). For example, the first layer 5261A may include silicon nitride (SiNx) and the second layer 5262A may include silicon oxide (SiOx), but the inorganic insulating materials of the first layer 5261A and the second layer 5262A may not be limited thereto.

The transmission filter layer 526 may transmit a portion of the light emitted from the light emitting element ED and reflect a remaining portion of the light. The transmission filter layer 526 may have a stacked structure including two inorganic layers 5261A and 5262A having different refractive indices, and thus, the difference of the refractive indices between adjacent two of the inorganic layers 5261A and 5262A may be repeatedly formed. Thus, the transmittance of the light incident into the transmission filter layer 526 may be changed according to an incident angle thereof.

Since the transmission filter layer 526, in which the inorganic layers having different refractive indices are stacked, is disposed on the first low refractive layer 521, the first low refractive layer 521 may form the distributed Bragg reflector (DBR) layer together with the transmission filter layer 526. Accordingly, the lights emitted from end surfaces of the light emitting element ED may be guided upwardly by the first low refractive layer 521 and the transmission filter layer 526. For example, the lights emitted from the light emitting element ED may be focused in the upward direction (i.e., the third direction DR3) by the first low refractive layer 521 and the transmission filter layer 526. Thus, the luminance of the display device 10 (refer to FIG. 1) may be increased.

While the invention has been illustrated and described with reference to the embodiments thereof, it will be apparent to those of ordinary skill in the art that various changes in form and detail may be formed thereto without departing from the spirit and scope of the invention.

What is claimed is:

1. A display device comprising:
an electrode layer including a first electrode and a second electrode that are spaced apart from each other and disposed on a substrate;
a light emitting element between the first electrode and the second electrode; and
a capping layer disposed on the light emitting element and including at least one low refractive layer and at least one high refractive layer that are alternately disposed, wherein
the capping layer comprises:
a first low refractive layer on the electrode layer and the light emitting element;
a first high refractive layer on the first low refractive layer; and
a second low refractive layer on the first high refractive layer, and
a thickness of the first low refractive layer is greater than a thickness of the second low refractive layer.

2. The display device of claim 1, wherein the thickness of the first low refractive layer is about 1.5 times to about 20 times greater than the thickness of the second low refractive layer.

3. The display device of claim 2, wherein the capping layer further comprises:
a third low refractive layer between the first high refractive layer and the second low refractive layer; and
a second high refractive layer between the third low refractive layer and the second low refractive layer.

4. The display device of claim 3, wherein the capping layer further comprises:
a fourth low refractive layer between the second high refractive layer and the second low refractive layer; and
a third high refractive layer between the fourth low refractive layer and the second low refractive layer.

5. The display device of claim 2, wherein
the light emitting element has a shape extending in one direction,
a longitudinal direction of the light emitting element is parallel to the substrate, and
the thickness of the first low refractive layer is greater than a width of the light emitting element.

6. The display device of claim 5, wherein
the light emitting element comprises:
a first semiconductor layer;
a second semiconductor layer spaced apart from the first semiconductor layer; and
an element active layer between the first semiconductor layer and the second semiconductor layer,
the first semiconductor layer, the element active layer, and the second semiconductor layer are sequentially disposed in the longitudinal direction of the light emitting element, and
a length of the first semiconductor layer and a length of the second semiconductor layer are different from each other.

7. The display device of claim 2, further comprising a second high refractive layer disposed on the second low refractive layer,
wherein a thickness of the second high refractive layer is smaller than the thickness of the first low refractive layer.

8. The display device of claim 1, wherein the thickness of the first low refractive layer is greater than a thickness of the first high refractive layer.

9. The display device of claim 1, wherein each of the at least one low refractive layer and the at least one high refractive layer include an inorganic material.

10. The display device of claim 1, wherein
a refractive index of the at least one low refractive layer is in a range of about 1.3 to about 1.6, and
a refractive index of the at least one high refractive layer is in a range of about 1.7 to about 2.4.

11. The display device of claim 1, wherein the capping layer covers the electrode layer and the light emitting element.

12. The display device of claim 11, further comprising a contact electrode on the light emitting element, wherein
the capping layer is disposed on the contact electrode, and
the contact electrode comprises:
a first contact electrode electrically connecting the first electrode to an end of the light emitting element; and
a second contact electrode spaced apart from the first contact electrode and electrically connecting the second electrode to another end of the light emitting element.

13. The display device of claim 12, wherein the capping layer covers the contact electrode.

14. The display device of claim 1, further comprising an insulating layer on the electrode layer, wherein
the insulating layer includes a stepped structure formed between the first electrode and the second electrode, and
the light emitting element overlaps the stepped structure on the insulating layer.

15. The display device of claim 14, wherein
a separation space is formed between the light emitting element and the insulating layer due to the stepped structure of the insulating layer, and
a portion of the first low refractive layer is disposed in the separation space.

16. The display device of claim 15, wherein the first low refractive layer contacts the light emitting element in the separation space.

17. A display device comprising:
a first electrode and a second electrode that are spaced apart from each other and disposed on a substrate;
a plurality of light emitting elements between the first electrode and the second electrode; and
a capping layer on the plurality of light emitting elements, wherein
the capping layer comprises:
a first inorganic layer having a first refractive index;
a second inorganic layer on the first inorganic layer and having a second refractive index; and
a third inorganic layer on the second inorganic layer and having a third refractive index,
the second refractive index is greater than the first refractive index and the third refractive index, and
a thickness of the first inorganic layer is greater than a thickness of the third inorganic layer.

18. The display device of claim 17, wherein the capping layer covers the first electrode, the second electrode, and the plurality of light emitting elements.

19. The display device of claim 17, wherein the thickness of the first inorganic layer is about 1.5 times to about 20 times greater than the thickness of the third inorganic layer.

20. The display device of claim 17, wherein the thickness of the first inorganic layer is greater than a thickness of the second inorganic layer.

* * * * *